(12) United States Patent
Cherniak et al.

(10) Patent No.: US 11,233,520 B2
(45) Date of Patent: Jan. 25, 2022

(54) DIGITAL FREQUENCY SYNTHESIZER WITH ROBUST INJECTION LOCKED DIVIDER

(71) Applicants: Infineon Technologies AG, Neubiberg (DE); Politecnico Di Milano, Milan (IT)

(72) Inventors: Dmytro Cherniak, Villach (AT); Salvatore Levantino, Mailand (IT); Marc Tiebout, Villach (AT); Roberto Nonis, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/073,181

(22) Filed: Oct. 16, 2020

(65) Prior Publication Data

US 2021/0036710 A1    Feb. 4, 2021

Related U.S. Application Data

(60) Continuation of application No. 16/189,949, filed on Nov. 13, 2018, now Pat. No. 10,826,508, which is a
(Continued)

(51) Int. Cl.
*H03L 7/24*    (2006.01)
*H03B 5/12*    (2006.01)
(Continued)

(52) U.S. Cl.
CPC ............... *H03L 7/24* (2013.01); *H03B 5/124* (2013.01); *H03B 5/1212* (2013.01);
(Continued)

(58) Field of Classification Search
CPC ......... H03L 7/24; H03L 7/0991; H03L 7/093; H03L 7/197; H03L 2207/50;
(Continued)

(56) References Cited

U.S. PATENT DOCUMENTS 7,856,212 B2    12/2010    Pellerano et al.
8,031,008 B2    10/2011    Wang et al.
(Continued)

FOREIGN PATENT DOCUMENTS

CN    102035566 A    4/2011
CN    103607201 A    2/2014
(Continued)

OTHER PUBLICATIONS

Office Action, in the Chinese language, from counterpart Chinese Application No. 201810152109.5, dated May 6, 2021, 8 pp.
(Continued)

*Primary Examiner* — Jung Kim
(74) *Attorney, Agent, or Firm* — Shumaker & Sieffert, P.A.

(57) ABSTRACT

A phased-locked loop (PLL) circuit with an injection locked digital digitally controlled oscillator (ILD) that has an ILD control input element, an ILD injection input element and an ILD output element. The PLL circuit also includes an adaptive control unit (ACU), wherein the ACU is configured to receive an error signal and is configured to output an ILD control word. The ILD control input element is configured to receive the ILD control word, and the ILD control word may set a natural oscillation frequency of the ILD. The ILD is further configured to output a first output signal from the ILD output element, where the natural oscillation frequency may set a frequency of the first output signal.

20 Claims, 12 Drawing Sheets

Related U.S. Application Data division of application No. 15/438,438, filed on Feb. 21, 2017, now Pat. No. 10,135,452.

(51) Int. Cl.
*H03L 7/197* (2006.01)
*H03L 7/093* (2006.01)
*H03L 7/099* (2006.01)

(52) U.S. Cl.
CPC ......... *H03B 5/1215* (2013.01); *H03B 5/1228* (2013.01); *H03L 7/093* (2013.01); *H03L 7/0991* (2013.01); *H03L 7/197* (2013.01); *H03B 2201/0208* (2013.01); *H03L 2207/50* (2013.01)

(58) Field of Classification Search
CPC .......... H03B 5/1212; H03B 2201/0208; H03B 5/124; H03B 5/1215; H03B 5/1228
See application file for complete search history.

(56) References Cited

U.S. PATENT DOCUMENTS

| | | | |
|---|---|---|---|
| 8,508,268 | B2 | 8/2013 | Shima |
| 8,669,795 | B2 | 3/2014 | Liu et al. |
| 8,791,763 | B2 | 7/2014 | Taghivand |
| 9,673,827 | B2 | 6/2017 | Sim et al. |
| 10,135,452 | B2 | 11/2018 | Cherniak et al. |
| 2011/0075595 | A1 | 3/2011 | Uno |
| 2014/0028355 | A1 | 1/2014 | Liu et al. |
| 2014/0266480 | A1 | 9/2014 | Li et al. |
| 2016/0099720 | A1 | 4/2016 | Bashir et al. |
| 2017/0346493 | A1 | 11/2017 | Markulic et al. |
| 2017/0366195 | A1 | 12/2017 | Kim et al. |
| 2018/0241406 | A1 | 8/2018 | Cherniak et al. |
| 2019/0081633 | A1 | 3/2019 | Cherniak et al. |

FOREIGN PATENT DOCUMENTS

| | | |
|---|---|---|
| CN | 105103438 A | 11/2015 |
| TW | 201406069 A | 2/2014 |

OTHER PUBLICATIONS

Cao, et al., "A 24GHz FMCW Radar Transmitter in 0.13 µm CMOS," Solid-State Circuits Conference, Sep. 15-19, 2008, 4 pp.
Joubert, et al., "Contribution to the study of a Phase-Domain ADPLL," 13th IEEE International Conference on Electronics, Circuits and Systems, Dec. 10-13, 2006, 6 pp.
Marzin, et al., "A 20 MB/s Phase Modulator Based on a 3.6 GHz Digital PLL with −36 dB EVM at 5 mW Power," IEEE Journal of Solid-State Circuits, vol. 47, No. 12, Dec. 2012, pp. 2974-2988.
Prosecution History from U.S. Appl. No. 15/438,438, dated from Dec. 7, 2017 through Jul. 25, 2018, 24 pp.
Prosecution History from U.S. Appl. No. 16/189,949, dated from May 8, 2019 through Jul. 1, 2020, 70 pp.

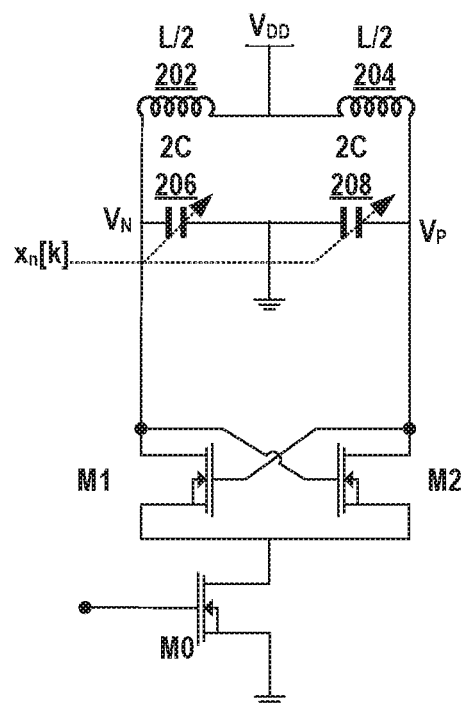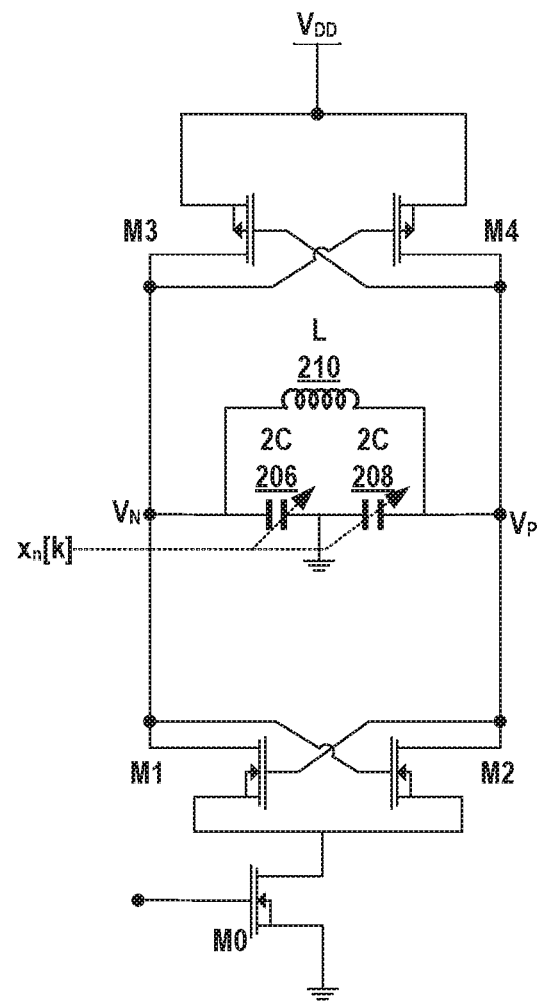
FIG. 2A
FIG. 2B

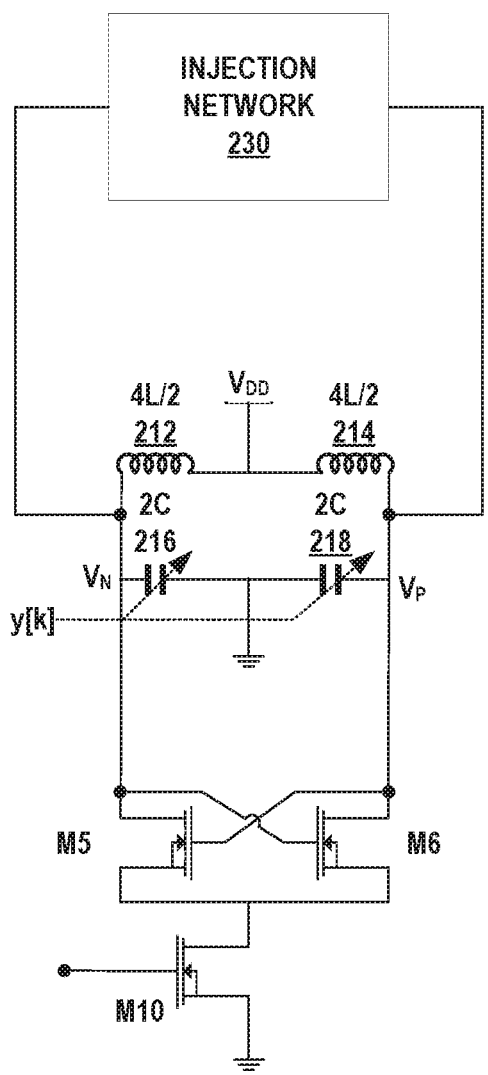
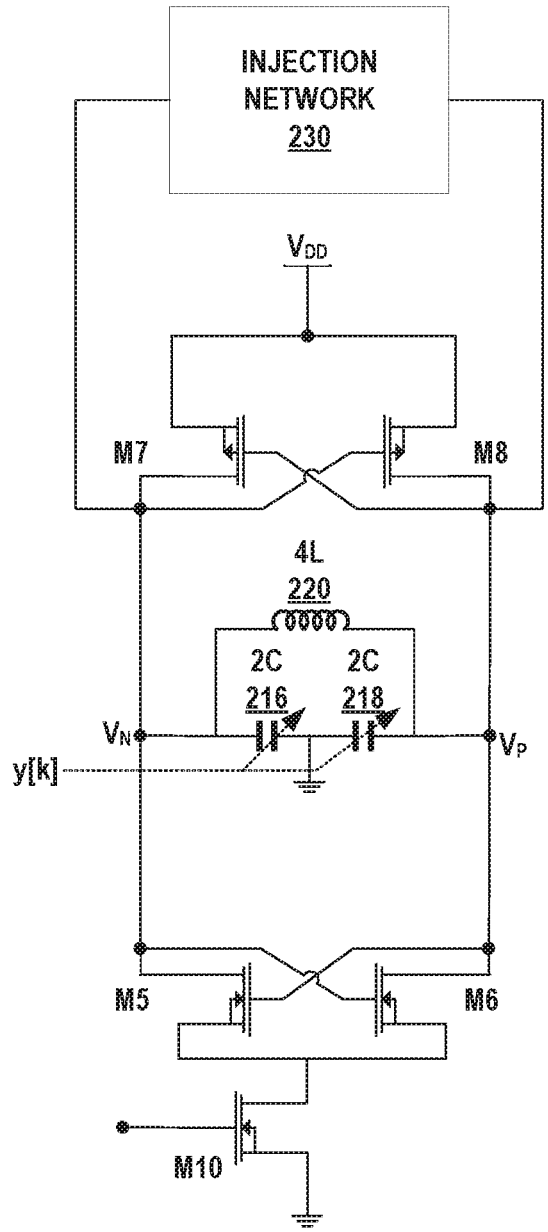
FIG. 2C
FIG. 2D

DIGITAL FREQUENCY SYNTHESIZER WITH ROBUST INJECTION LOCKED DIVIDER

This application is a continuation application of U.S. patent application Ser. No. 16/189,949, filed Nov. 13, 2018, now U.S. Pat. No. 10,826,508, which is a divisional application of U.S. patent application Ser. No. 15/438,438, filed Feb. 21, 2017, now U.S. Pat. No. 10,135,452, the entire content each of which is incorporated by reference herein in its entirety.

TECHNICAL FIELD

The disclosure relates to digitally controlled oscillator and digitally controlled injection locked divider circuits.

BACKGROUND

Phase-Locked Loop (PLL) frequency synthesizers may employ injection-locked digitally controlled oscillators (ILD) as a first stage of a feedback frequency divider. An ILD may use less power when compared to other types of frequency dividers. A disadvantage of the ILD is a limited injection locking range over only a narrow frequency band. This limited locking range may additionally depend on manufacturing process variation. Furthermore, some applications that include PLLs may operate with frequency modulation that has a large input amplitude, such a frequency modulated continuous wave (FMCW) radar. An ILD that can operate with high amplitude frequency modulation may introduce unwanted noise. Therefore, design of a wide locking range and low-noise ILD may be a reason some applications will use a current-mode logic (CIVIL) frequency dividers, though a CML frequency divider may consume more power than an ILD.

SUMMARY

In general, the disclosure is directed to a frequency synthesizer circuit including digitally controlled oscillator (DCO) and an injection locked digitally controlled oscillator (ILD). The ILD outputs a signal with a frequency that is some fraction of the frequency of the DCO output signal and locked in phase to the DCO output signal. A frequency synthesizer circuit according to the techniques of this disclosure drives the ILD with the same modulation input signal that drives the DCO, with the modulation input signal scaled to account for any mismatch between the gains of the DCO and ILD. Driving the ILD with the same, scaled modulation signal as the main DCO minimizes the frequency offset between the DCO output signal and the divided natural oscillation frequency of the ILD. Minimizing the frequency offset makes the lock of the ILD more robust and reduces jitter contribution from the ILD.

In one example, the disclosure is directed to a circuit comprising: a digitally controlled oscillator (DCO); and an injection locked digital digitally controlled oscillator frequency divider (ILD) that is configured to tune a natural oscillation frequency of the ILD to track a first signal from the DCO.

In another example, the disclosure is directed to a phased-locked loop (PLL) circuit comprising: an injection locked digital digitally controlled oscillator frequency divider (ILD) with an ILD control input element, an ILD injection input element and an ILD output element, an adaptive control unit (ACU), wherein the ACU: receives an error signal and a first modulation input signal and outputs an ILD control signal and a digitally controlled oscillator (DCO) control signal. The circuit further comprises a digital loop filter (DLF), wherein the DLF receives the error signal and outputs a filtered error signal to the ACU, and wherein: the ILD control input element receives the ILD control signal, wherein the ILD control word sets a natural oscillation frequency of the ILD, the ILD outputs a first output signal from the ILD output element, wherein the natural oscillation frequency sets a frequency of the first output signal, and the error signal comprises the first output signal.

In another example, the disclosure is directed to a method comprising a method comprising switching a phased locked loop (PLL) to calibration mode, wherein calibration mode comprises: isolating a main oscillator from the PLL, switching a control input of an injection locked digitally controlled oscillator (ILD)frequency divider of the PLL to receive a first input control signal, operating the PLL with the ILD as a PLL oscillator, and estimating, by an adaptive control unit (ACU) of the PLL, a calibration value, wherein: the ACU receives as input an error signal and a first modulation input signal, and the calibration value correlates a first modulation input signal to a second modulation input signal.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIGS. 2A-2D depict example DCO and ILD circuits implemented as LC oscillators, such as may be used in high performance millimeter wave (mm wave) frequency synthesizers.

DETAILED DESCRIPTION

This disclosure is directed to a frequency synthesizer circuit including digitally controlled oscillator (DCO) and an injection locked digitally controlled oscillator (ILD). The ILD outputs a signal with a frequency that is some fraction of the frequency of the DCO output signal and locked in phase to the DCO output signal. A frequency synthesizer circuit according to the techniques of this disclosure drives the ILD with the same modulation input signal that drives the DCO, with the modulation signal scaled to account for any mismatch between the gains of the DCO and ILD. The input gain to the ILD is the scaling factor. Driving the ILD with the same, scaled modulation signal as the main DCO minimizes the frequency offset between the DCO output signal and the divided natural oscillation frequency of the ILD. Minimizing the frequency offset makes the lock of the ILD more robust and reduces jitter contribution from the ILD.

The ILD in the frequency synthesizer circuit consumes significantly less power compared to current-mode logic (CML) frequency dividers. In some examples the ILD can consume ten times less power than a CML frequency divider. A frequency synthesizer circuit according to the techniques of this disclosure overcomes the drawback of small locking range of an ILD and results in a robust ILD. With a robust ILD, the frequency synthesizer circuit may operate with a large modulation amplitude, such as required for FMCW radar applications.

Additionally, a frequency synthesizer circuit with robust ILD may be included in a phase-locked loop (PLL) circuit that includes a novel calibration arrangement. In calibration mode, the ILD may act as the main PLL oscillator in the PLL circuit, while the DCO is isolated from the loop. Using adaptive filtering, or a similar method to determine the gain of an unknown system, the input gain to the ILD, which is acting as the PLL oscillator can be obtained. The PLL circuit sets this input gain estimated during calibration mode to be the coefficient for the modulation signal input to the ILD. This input gain is the same scaling factor used as the ILD input gain described above. In operating mode, the DCO is returned to the loop and calibration circuitry goes back to estimating the input gain for the DCO. This calibration, combined with continuous tuning of the ILD natural frequency, yields a PLL frequency synthesizer with a robust ILD. Using a robust ILD may consume significantly less power for a PLL that may be used in a wide variety of circuits including radar applications, AM and FM signal demodulation and other applications.

Figure 1A:
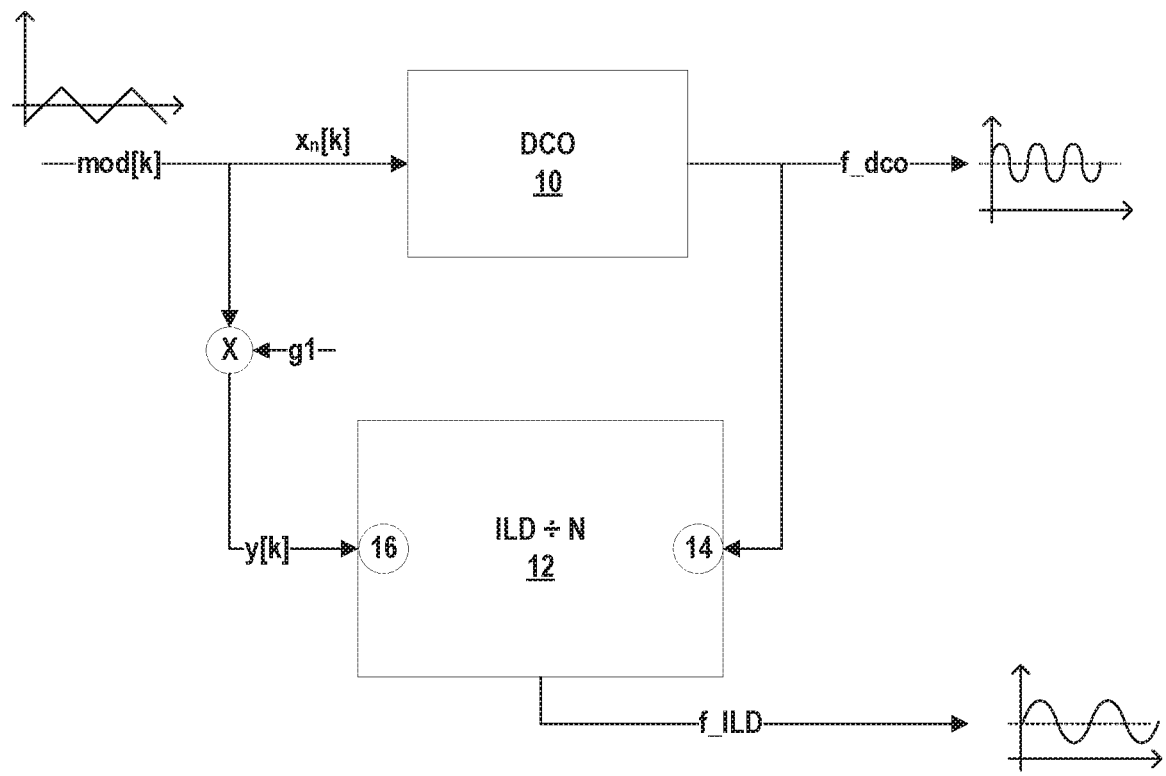
FIG. 1A is a schematic and block diagram illustrating an example frequency synthesizer circuit including digitally controlled oscillator (DCO) and an injection locked digitally controlled oscillator (ILD) in accordance with one or more techniques of this disclosure.

FIG. 1A is a schematic and block diagram illustrating an example frequency synthesizer circuit including digitally controlled oscillator (DCO) and an injection locked digitally controlled oscillator (ILD) in accordance with one or more techniques of this disclosure. The injection locked digitally controlled oscillator may be abbreviated with ILDCO in some examples, however, this disclosure will primarily use ILD.

The example circuit of FIG. 1A includes DCO 10 and ILD 12. The output of DCO 10 connects to an injection input 14 of ILD 12. DCO 10 outputs a signal at frequency f_DCO to the injection input 14 of ILD 12. DCO 10 receives an input control word $x_n[k]$. In the example of FIG. 1A input control word $x_n[k]$ is the same as the modulation input mod[k]. Input control word $x_n[k]$ to the input of DCO 10 sets the frequency, f_DCO, at the output of DCO 10. The linearized tuning characteristic of DCO 10 follows the equation:

$$f\_dco[k] = f0\_dco + K\_dco * mod[k]$$

where f0_dco is the natural oscillation frequency of DCO 10 and K_dco is the DCO gain.

A DCO, like DCO 10, is an oscillator circuit that generates an analog signal, but whose output frequency, f_dco, is controlled by a digital control input. In the example of FIG. 1A the digital control input is input control word $x_n[k]$.

An ILD, such as ILD 12, operates on the principle that a free-running oscillator which has a small amount of a higher-frequency signal injected to it will tend to oscillate in step with the injected input signal. In some examples an input to a component in this disclosure, such as ILD 12, may be considered an input element or an input port. For example, injection input 14 may be considered injection input element 14 or injection input port 14. Any of these terms are equivalent throughout this disclosure, unless otherwise noted.

In an ILD, like ILD 12, the frequency of the input signal at injection input 14 is a multiple (or fraction) of the free-running frequency of the oscillator within ILD 12. ILD 12 receives a second input control word, y[k] at the control input 16 of ILD 12. Input control word y[k] sets the natural oscillation frequency, f0_ild, of ILD 12, similar to how control word $x_n[k]$ sets the frequency f_DCO of DCO 10. The natural oscillation frequency, f0_ild, may also be called the free-running oscillation frequency. In the example of FIG. 1A, input control word y[k] is the same mod[k] received by DCO10, but scaled by a coefficient g1. In the example of FIG. 1A, coefficient g1 may also be called the input gain to ILD 12 and follows the equation:

$$g1 = \frac{K\_dco}{K\_ild}$$

where K_dco is the gain of DCO 10 and K_ildco is the gain of ILD 12. Therefore, ILD 12 receives the same modulation input, mod[k], as main DCO 10 but scaled to account for any mismatch between DCO and ILD gains. The value of coefficient g1 can be identified by digital techniques such as a counter based method or an adaptive filter technique which will be described in more detail in FIGS. 8-9 below. The DCO/ILD topology depicted in FIG. 1A, and FIGS. 3-9 below, enable the use of these digital techniques. In some examples, the circuit may take some time after start-up for coefficient g1 to converge. The time may depend on the reference frequency, and in some examples, may be in the range of 10-100 µs.

This solution as depicted by FIG. 1A minimizes the frequency offset between the scaled natural oscillation frequency, $N*f0\_ild$, of the ILD and the DCO frequency ($f\_dco$) during modulation, where N is the ILD division ratio. The solution depicted in the example of FIG. 1A makes the frequency lock of ILD 12 to DCO 10 more robust and reduces its jitter contribution. Jitter will be discussed in more detail in FIG. 1B. The linearized tuning characteristic of ILD 12 follows the equation:

$$f\_ild[k]=f0\_ild+K\_ild*y[k]$$

where $f\_ild[k]*N=f\_dco[k]$.

In operation, the example circuit of FIG. 1A receives a modulation input, $mod[k]$ and outputs two signals. The first signal is the output of DCO 10 with frequency $f\_dco$ and the output of ILD 12 with frequency $f\_ild$. The frequency of the signal output by ILD 12, $f\_ild$, may be some fraction of the signal output by DCO 10, $f\_dco$, such as ½, ¼ or a similar fraction. In some examples, the division ratio, N=1, which would make $f\_dco=f\_idc$. The output of ILD 12 will be approximately equal to some fraction of $f\_dco$, within manufacturing and measurement tolerances. The phase and frequency of the ILD output signal will lock to the phase of the DCO output signal. In other words, the phase of the ILD output signal is synchronized to the phase of the DCO output signal. The arrangement of the circuit of FIG. 1A minimizes the difference between the natural frequency of ILD 12, $f0\_ild$ and the injected frequency, $f\_dco$, thereby ensuring that $f\_dco$ is within the locking range of ILD 12. The locking range is the range of the input injected frequency of the ILD in which the ILD still locks in phase to the injected input frequency at ILD injection input 14.

While ILDs tend to consume less power than broadband, static, flip-flop based, CML frequency dividers, the drawback of an ILD, in general, is a low locking range. If the injection frequency to an ILD is outside the ILD locking range, the ILD may not be able to oscillate in step with the injection input oscillation. In some ILD implementations, the ILD locking range is inversely proportional to the quality factor (Q) of the oscillator tank. For example, in an integrated circuit design, dependency on Q may make an ILD sensitive to process variations. In accordance with the techniques of this disclosure, input control word $y[k]$ ensures the natural frequency, $f0\_ild$, follows the same modulation input, $mod[k]$ as the main DCO. Therefore, the ILD natural frequency, $f0\_ild$, follows the injection signal frequency, $f\_dco$, from DCO 10 to ILD 12. In this manner, the circuit of FIG. 1A ensures the frequency of the injection signal, $f\_dco$, and the natural frequency of the ILD, $f0\_ild$, stay within the locking range of ILD 12, thereby ensuring the phase of the output signals from both DCO 10 and ILD 12 remain synchronized over a wide frequency range. This manner of the ILD natural frequency tracking the injection frequency is in contrast to conventional ILD examples that attempt to implement an ILD with a single, wide bandwidth frequency range.

The DCO/ILD topology described in FIG. 1A, and in FIG. 3 below, may be used in a direct-modulation scheme, such as in RF transmitters. The circuit of FIGS. 1A and 3 allow frequency modulation in an open-loop configuration with both the output of the main DCO, DCO 10, and a pre-scaled (divided) output from ILD 12. The use of an injection locked digitally controlled oscillator, such as ILD 12, as a frequency divider in a direct modulation scheme might be advantageous for several reasons. For example, the frequency divider may provide a convenient clock distribution to several transmitters or may avoid operating both the main DCO and a transmitter power amplifier at the same frequency. One advantage of operating an RF transmitter at a different frequency than the main DCO of an RF transmitter circuit may include reducing the likelihood of frequency pulling or other interference.

The circuit arrangement of DCO 10 with ILD 12 depicted in FIG. 1A may ensure low power robust frequency synthesizer operation. In other words, the circuit of FIG. 1A moves the ILD natural frequency to match the injection frequency $f\_dco$. Additionally, the techniques of this disclosure exploit digital techniques to estimate the gain of the ILD and feed the DCO control signal information to the ILD to ensure robust operation of the frequency synthesizer over a wide set of conditions. Digital techniques to estimate the gain will be discussed in more detail in FIGS. 8-10 below. The terms control signal and control word may be used interchangeably in this disclosure, unless otherwise noted.

Figure 1B:
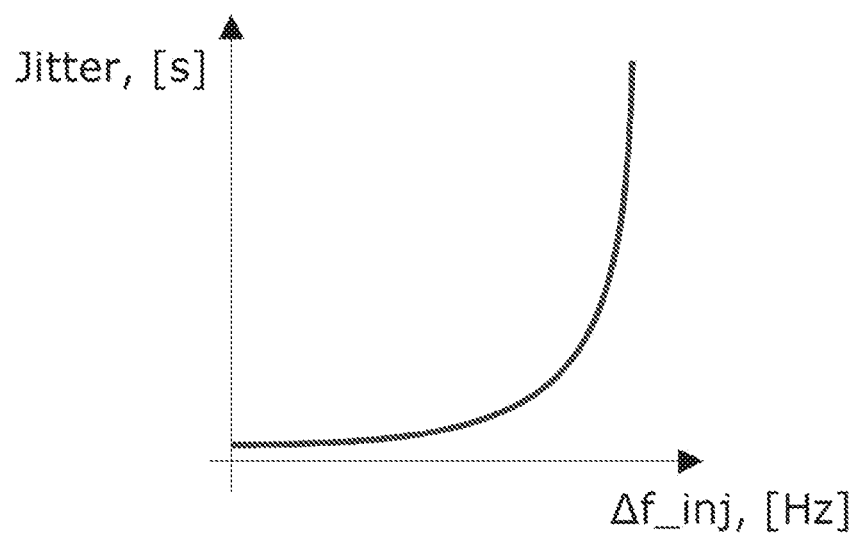
FIG. 1B is a graph depicting the impact on jitter caused by the difference between the ILD natural frequency and the injected frequency.

FIG. 1B is a graph depicting the impact on jitter caused by the difference between the ILD natural frequency and the injected frequency. Phase noise is defined as the noise arising from the short-term phase fluctuations that occur in a signal. The related term to phase noise in the time domain is jitter. All signals have some phase noise or jitter in them. For receivers, phase noise on the local oscillators within the system may affect mixing and the noise floor. For transmitters phase noise, or jitter, may affect the transmitted wideband noise levels. For systems using phase modulation, jitter may affect the bit error rate because individual bits of data represented by the phase may be misread. Therefore, in some examples, systems with less jitter may have advantages over systems with more jitter.

As depicted by FIG. 1B, as $\Delta f\_inj$ increases, the jitter increases, where $\Delta f\_inj$ is defined according to the equation:

$$\Delta f\_inj=f\_dco-N*f\_ild$$

As described above, the topology depicted by FIG. 1A ensures the divided natural frequency of ILD 12, $N*f0\_ild$ remains within the locking range of the signal, $f\_dco$, received by the injection input 14 of ILD 12. This has the advantage of ensuring the phase of ILD 12 output signal is synchronized to the phase of the output signal from DCO 10. An additional advantage includes ensuring a low $\Delta f\_inj$, which may reduce jitter, as depicted by FIG. 1B. The topology of the circuit of FIG. 1A may have advantages over conventional ILD designs that attempt to implement a wide bandwidth ILD with a large locking range. An ILD with a wide locking range may still cause jitter when $\Delta f\_inj$ is large, such as at the edges of the ILD locking range. The techniques depicted by FIG. 1A make a low power ILD feasible in high frequencies applications, including applications that include frequency modulation (FM) such as FMCW radar.

FIGS. 2A and 2B depict example circuit implementations for a DCO, in accordance with one or more techniques of this disclosure. The circuits depicted in FIGS. 2A and 2B are just two of the many possible implementations of a DCO, such as DCO 10 depicted in FIGS. 1 and 3-10. For example, by rearranging the $V_{DD}$ and ground, the N-channel MOSFETs depicted as M0-M2 could be replaced with P-channel MOSFETs.

FIGS. 2A and 2B depicts example DCO circuits implemented as LC oscillators, such as may be used in high performance millimeter wave (mm wave) frequency synthesizers. The circuit of FIG. 2A includes transistors M0-M2, capacitors 206 and 208, inductors 202 and 204, and a power supply VDD. The source of M0 connects to ground and the drain of M0 connects to the sources of both M1 and M2. The gate of M2 connects to the drain of M1 as well as to the $V_N$ side of capacitor 206 and inductor 202. Similarly, the gate of M1 connects to the drain of M2 as well as to the $V_P$ side of capacitor 208 and inductor 204. Inductors 202 and 204 connect to $V_{DD}$ and each other at the terminals opposite to $V_N$ and $V_P$. Inductors 202 and 204 each have an inductance value of L/2, where L is an inductance selected depending on the desired performance of the DCO.

Similarly, capacitors 206 and 208 connect to ground or each other at the terminals opposite to $V_N$ and $V_P$. In other words, capacitors 206 and 208 may be connected to ground or differentially. When connected differentially, the common mode between the capacitors is floating and not connected to ground. Capacitors 206 and 208 each have a capacitance value of 2C, where C is a capacitance selected depending on the desired performance of the DCO. The DCO of FIG. 2A, receives the input control word $x_n[k]$ at capacitors 206 and 208. The input control word $x_n[k]$ and y[k] in FIGS. 2A-2D are the same as the input control words $x_n[k]$ and y[k] depicted in FIG. 1A.

The DCO circuit of FIG. 2B operates similarly to the DCO of FIG. 2A and DCO 10 of FIGS. 1 and 3-10. FIG. 2B depicts a DCO with two additional transistors M3 and M4 and a single inductor 210. As with FIG. 2A, the source of M0 connects to ground and the drain of M0 connects to the sources of both M1 and M2. . The gate of M2 connects to the drain of M1 as well as to the $V_N$ side of capacitor 206 and inductor 210. Similarly, the gate of M1 connects to the drain of M2 as well as to the $V_P$ side of capacitor 208 and inductor 210. Inductor 210 of FIG. 2B has a value of L=L/2+L/2 to yield an approximately equal performance to the DCO circuit of FIG. 2A, within manufacturing and measurement tolerances.

Additionally, in the example of FIG. 2B, $V_{DD}$ connects to both the sources of transistors M3 and M4. The gate of M4 connects to the drain of M3 and to $V_N$. The gate of M3 connects to the drain of M4 and to $V_P$. The DCO of FIG. 2B, receives input control word $x_n[k]$ at capacitors 206 and 208 as described above in FIG. 2A.

FIGS. 2C and 2D depict example circuit implementations for an ILD, in accordance with one or more techniques of this disclosure. As with FIGS. 2A and 2B above, the circuits depicted in FIGS. 2C and 2D are just two of the many possible implementations of an ILDO, such as ILD 12 depicted in FIGS. 1 and 3-10.

FIGS. 2C and 2D depict example circuit implementations for an ILD, in accordance with one or more techniques of this disclosure. The circuits depicted in FIGS. 2C and 2D are just two of the many possible implementations of an ILDO, such as ILD 12 depicted in FIGS. 1 and 3-10.

FIG. 2C depicts an ILD circuit that includes transistors M10, M5 and M6, capacitors 216 and 218, inductors 212 and 214, an injection network 230 and a power supply VDD. The source of M10 connects to ground and the drain of M10 connects to the sources of both M5 and M6. . The gate of M6 connects to the drain of M5 as well as to the $V_N$ side of capacitor 216 and inductor 212. Similarly, the gate of M5 connects to the drain of M6 as well as to the $V_P$ side of capacitor 218 and inductor 214. Inductors 212 and 214 connect to $V_{DD}$ and each other at the terminals opposite to $V_N$ and $V_P$. Inductors 212 and 214 each have an inductance value of 4L/2, where L is an inductance selected depending on the desired performance of the DCO. This gives the free-running ILD frequency of FIG. 2C half that of the DCO circuits depicted in FIGS. 2A and 2B. In other examples the capacitance of FIG. 2C could be four times the capacitance of FIGS. 2A and 2B, or the inductance and capacitance ratios could be split in a different proportion. Each terminal of injection network 230 connects to $V_N$ and $V_P$, respectively.

Similarly, capacitors 216 and 218 connect to ground and each other at the terminals opposite to $V_N$ and $V_P$. Capacitors 216 and 218 each have a capacitance value of 2C (not to be confused with FIG. 2C), where C is a capacitance selected depending on the desired performance of the DCO. The ILD of FIG. 2C, receives the input control word y[k] at capacitors 216 and 218.

The ILD circuit of FIG. 2D operates similarly to the ILD of FIG. 2C and ILD 12 of FIGS. 1 and 3-9. FIG. 2D depicts an ILD with two additional transistors M7 and M8 and a single inductor 220. As with FIG. 2C, the source of M10 connects to ground and the drain of M10 connects to the sources of both M5 and M6. . The gate of M6 connects to the drain of M5 as well as to the $V_N$ side of capacitor 216 and inductor 220. Similarly, the gate of M5 connects to the drain of M6 as well as to the $V_P$ side of capacitor 218 and inductor 220. Each terminal of injection network 230 connects to $V_N$ and $V_P$, respectively. Inductor 220 of FIG. 2C has a value of 4L to yield an approximately equal performance to the ILD circuit of FIG. 2C, within manufacturing and measurement tolerances. As described above for FIG. 2C, this value of inductance gives the free-running ILD frequency of FIG. 2D half that of the DCO circuits depicted in FIGS. 2A and 2B. The inductance and capacitance ratios could be split in a different proportion. Also, in some examples the capacitors may be connected to ground, as shown in FIG. 2C, or connected differentially.

Additionally, in the example of FIG. 2B, $V_{DD}$ connects to both the sources of transistors M7 and M8. The gate of M8 connects to the drain of M7 and to $V_N$. The gate of M7 connects to the drain of M8 and to $V_P$. The DCO of FIG. 2B, receives input control word y[k] at capacitors 216 and 218 as described above in FIG. 2A.

The circuits in the FIGS. 2A-2D may be used as DCO 10 and ILD 12 depicted in FIGS. 1 and 3-9 of this disclosure. The arrangement of DCO 10 and ILD 12 in these examples ensure ILD 12 receives the same modulation input, mod[k] scaled to account for the difference in gains between ILD 12 and DCO 10. This arrangement overcomes the disadvantage inherent in an ILD of limited locking range and may have advantages over other conventional solutions. For example, a conventional attempt to overcome the limited locking range of an ILD may include an LC based ILD with the components matched to an LC based voltage controlled oscillator (VCO), with the VCO acting as the main oscillator. This type of circuit may use the same analog tuning control voltage for both the ILD and VCO to adjust the free-running oscillation frequency of the ILD together with VCO to ensure adjustment of the ILD locking range. However, the disadvantage of this conventional attempted solution is that it relies on matching of two oscillators, which may result in decreased robustness and significantly higher manufacturing cost, including scrap costs. Higher scrap costs result when components that do not match within tight manufacturing tolerances must be scrapped or used in other applications. In contrast, the techniques of this disclosure ensure a robust performance, a synchronized phase in the DCO and ILD output signal, and low jitter without relying on closely matched components that may be dependent on manufacturing process variation.

Figure 3:
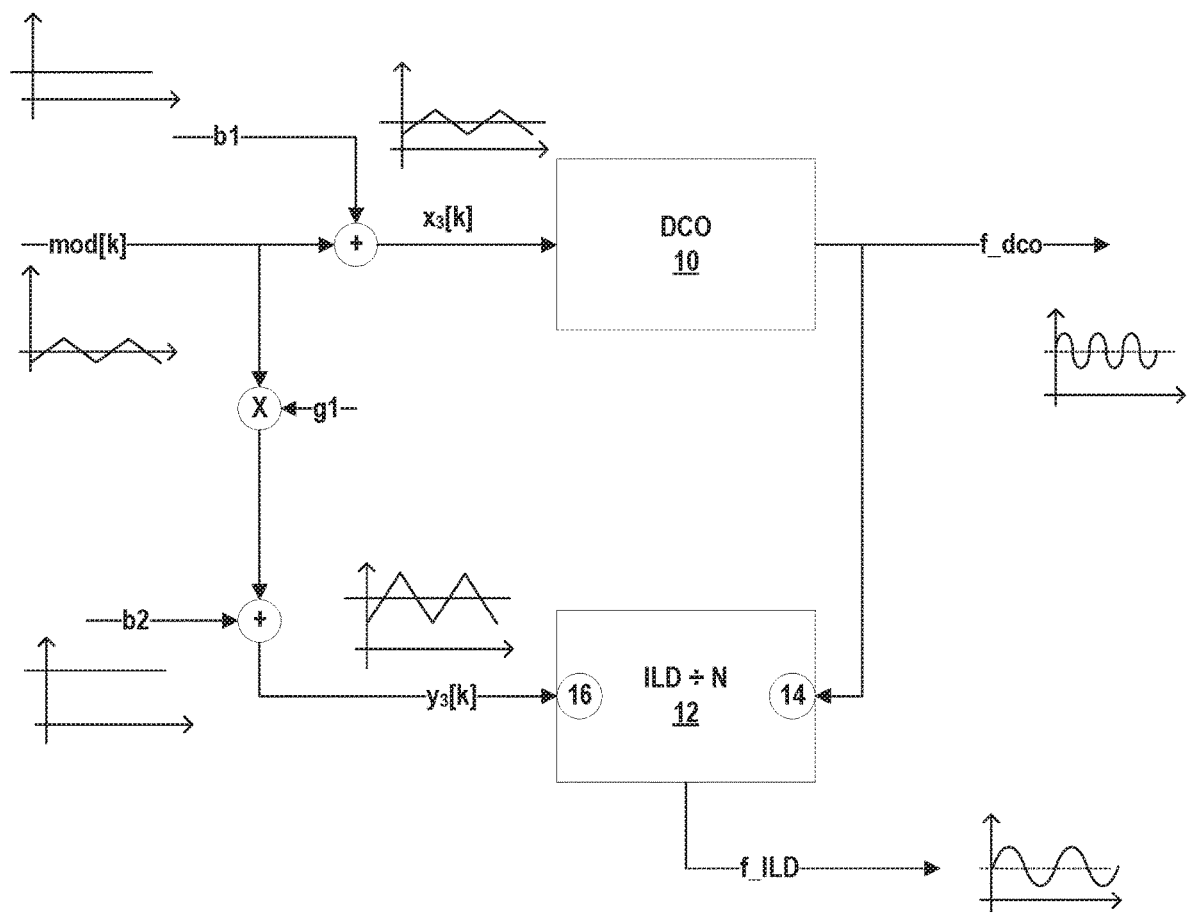
FIG. 3 is a schematic and block diagram illustrating an example frequency synthesizer circuit including digitally controlled oscillator (DCO) and an injection locked digitally controlled oscillator (ILD) in accordance with one or more techniques of this disclosure.

FIG. 3 is a schematic and block diagram illustrating an example frequency synthesizer circuit including digitally controlled oscillator (DCO) and an injection locked digitally controlled oscillator (ILD) in accordance with one or more techniques of this disclosure. The circuit of FIG. 3 is similar to the circuit of FIG. 1A, with two additional bias signals b1 and b2 are used to account for the frequency offset between natural oscillation frequencies of DCO 10 and ILD 12, where the natural oscillation frequency of ILD 12 is divided by the division ratio N. In other words, bias signals b1 and b2 are part of the circuit calibration to account for differences between f0_dco and N*f0_ild. The example of FIG. 3 is just one of several possible implementations of the DCO/ILD topology described in FIG. 1A that provides robust performance to overcome the small locking range of an ILD.

In the example of FIG. 3, DCO 10 and ILD 12 perform the same functions as described in FIG. 1A. DCO 10 receives input control word x3[k], which is the sum of mod[k] and signal b 1. ILD 12 receives input control word y3 [k] at control input 16. As with FIG. 1A, input control word y3[k] includes the same modulation input as received by DCO 10, with additional scaling. In the example of FIG. 3, y3[k] follows the equation:

$$y_3[k]=b2+g1*\mathrm{mod}[k]$$

In the context of FIG. 3, the "operating bias" refers to the offset of the ILD tuning word. In this example, "bias" is a digital tuning word which is added to the modulation signal to account for the offset between natural oscillation frequency of the ILD and center frequency of the DCO. The addition of bias signals b1 and b2 in example of FIG. 3 allow independent control of the operating bias of ILD 12 and DCO 10. The values of b1 and b2 and may be set such that f_dco=f_ild*N when mod[k]=0. In other words, selecting the values of b1 and b2 may ensure the frequency of the DCO output, f_dco approximately equals the frequency of the ILD output, f_ild, within manufacturing and measurement tolerances.

The DCO/ILD topology described in FIG. 3, as with FIG. 1A, may be used in a direct-modulation scheme, such as in RF transmitters, in phase-locked loops (PLL or similar applications that use frequency synthesizers. The circuit arrangement of DCO 10 with ILD 12 depicted in FIGS. 1A and 3 may ensure low power robust frequency synthesizer operation and may operate with a large frequency modulation (FM) input. This includes an FM input with large frequency amplitude, such as may be found in frequency modulated continuous wave (FMCW) radar.

Figure 4:
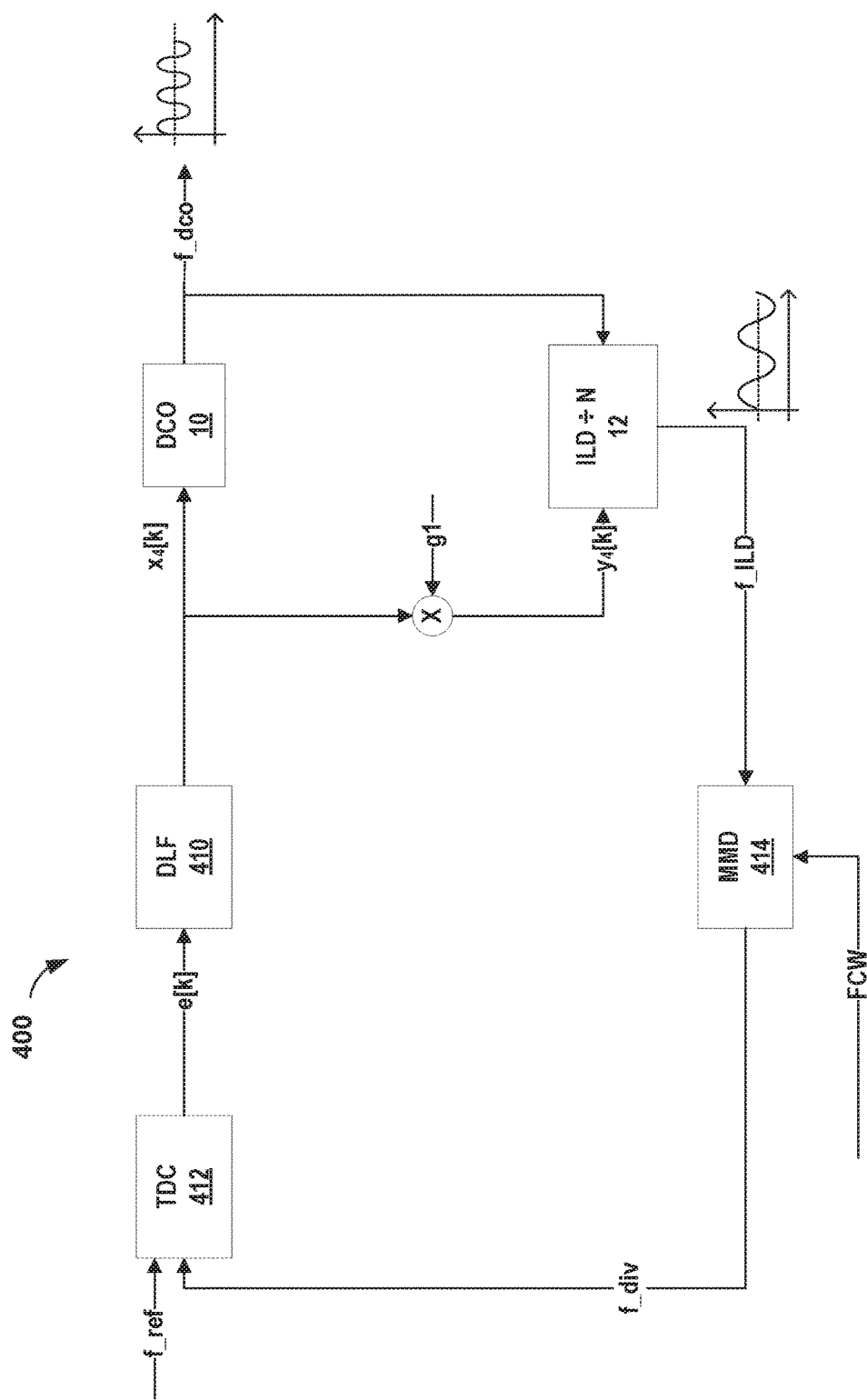
FIG. 4 is a schematic and conceptual block diagram illustrating an example phase-locked loop (PLL) circuit using a robust DCO/ILD topology in accordance with one or more techniques of this disclosure.

FIG. 4 is a schematic and conceptual block diagram illustrating an example phase-locked loop (PLL) circuit using a robust DCO/ILD topology in accordance with one or more techniques of this disclosure. PLL 400 of FIG. 4 does not include a modulation input.

PLL 400 is a programmable frequency synthesizer that outputs a signal that tracks the phase and frequency of an input reference signal, f_ref. A PLL, such as PLL 400, synchronizes the DCO output signal frequency to the input reference signal through feedback. The example of PLL 400 includes DCO 10 with robust ILD 12, which perform the same functions as DCO 10 and ILD 12 depicted in FIG. 1A. The architecture of PLL 400 allows the ILD to track frequency variation imposed by the frequency command word, FCW, input. Because input control word y4[k] to ILD 12 is the same as input control word x4[k], scaled by coefficient g1, this ensures robust operation over a wide tuning frequency range. In other words, input control word y4[k] follows the equation:

$$y_4[k]=x_4[k]*g1.$$

In an example where control word x4[k] sweeps the frequency of DCO 10, the topology of PLL 400 simultaneously tunes the natural frequency of ILD 12 to follow the frequency sweep and keep the frequency f_dco within locking range of ILD 12. This topology also minimizes jitter as described above in reference to FIG. 1B.

Coefficient g1 performs the same function as described above, for example in FIG. 1A and is determined in the same manner. Input control word y4[k] ensures the natural frequency of ILD 12 remains within ILD locking range of the injection input signal frequency, f_dco. Therefore, PLL 400, according to the techniques of this disclosure, may be used for a variety of different frequency bands, such as for different communication standards.

In addition to the DCO/ILD topology of FIG. 1A, PLL 400 includes digital loop filter, DLF 410, time-to-digital converter, TDC 412, and multi-modulus divider MMD 414. The output of PLL 400 is the output of DCO 10. The output signal of PLL 400 has a frequency f_dco. The input to PLL 400 is reference signal, f_ref.

TDC 412 receives the feedback signal, f_div, from MMD 414 and reference signal f_ref. TDC 412 converts the delay between feedback signal, f_div, and reference signal f_ref, directly into a digital quantity, error signal e[k]. Error signal e[k] is the difference between the reference signal, f_ref, including phase and frequency, and the feedback signal f_div.

MMD 414 is a frequency divider, also called a prescaler in some examples. The modulus of a prescaler is its frequency divisor. A dual-modulus prescaler has two separate frequency divisors, such as M and M+1. In other words, a dual-modulus prescaler is one that has the ability to selectively divide the input frequency by one of two integers, such as 32 and 33. A multi-modulus divider, such as MMD 414, may have the ability to selectively divide the input frequency by one of a plurality of integers.

MMD 414 performs a frequency divider function in PLL 400 to output a reduced feedback frequency f_div as well as provide programmability of the frequency synthesizer. TDC 412 may not be able to operate a high frequency. In some high frequency applications, TDC 412 may not be able to directly receive the feedback signal from f_ILD, which may be in the GHz range. MMD 414 acts to reduce the frequency of feedback signal f_div to a frequency that TDC 412 can receive. MMD 414 receives the output signal from ILD 12, f_ild as well as FCW. In some examples FCW may be considered a frequency command word or frequency control word. FCW digitally controls the output frequency of PLL 400.

DLF 410 filters noise present in error signal e[k]. In some examples DLF 410 may include both low-pass filter and high-pass filter functions. In some examples, only the integral part of the output of DLF 410 may be forwarded to ILD 12.

PLL 400 may also be used to demodulate frequency-modulated signals. In the example of a radio transmitters, PLL 400 may be used to synthesize new frequencies which are a multiple of a reference frequency, with the same stability as the reference frequency.

A PLL in accordance with the techniques of this disclosure, such as PLL 400, feeds the same control word signal information to ILD 12 as to DCO 10. The combination the control word information fed to both DCO 10 and ILD 12, and exploiting digital techniques to estimate coefficient g1 of the ILD ensures robust operation of the frequency synthesizer, PLL 400, over a wide range of conditions, as described above and in more detail in relation to FIGS. 8 and 9 below.

Figure 5:
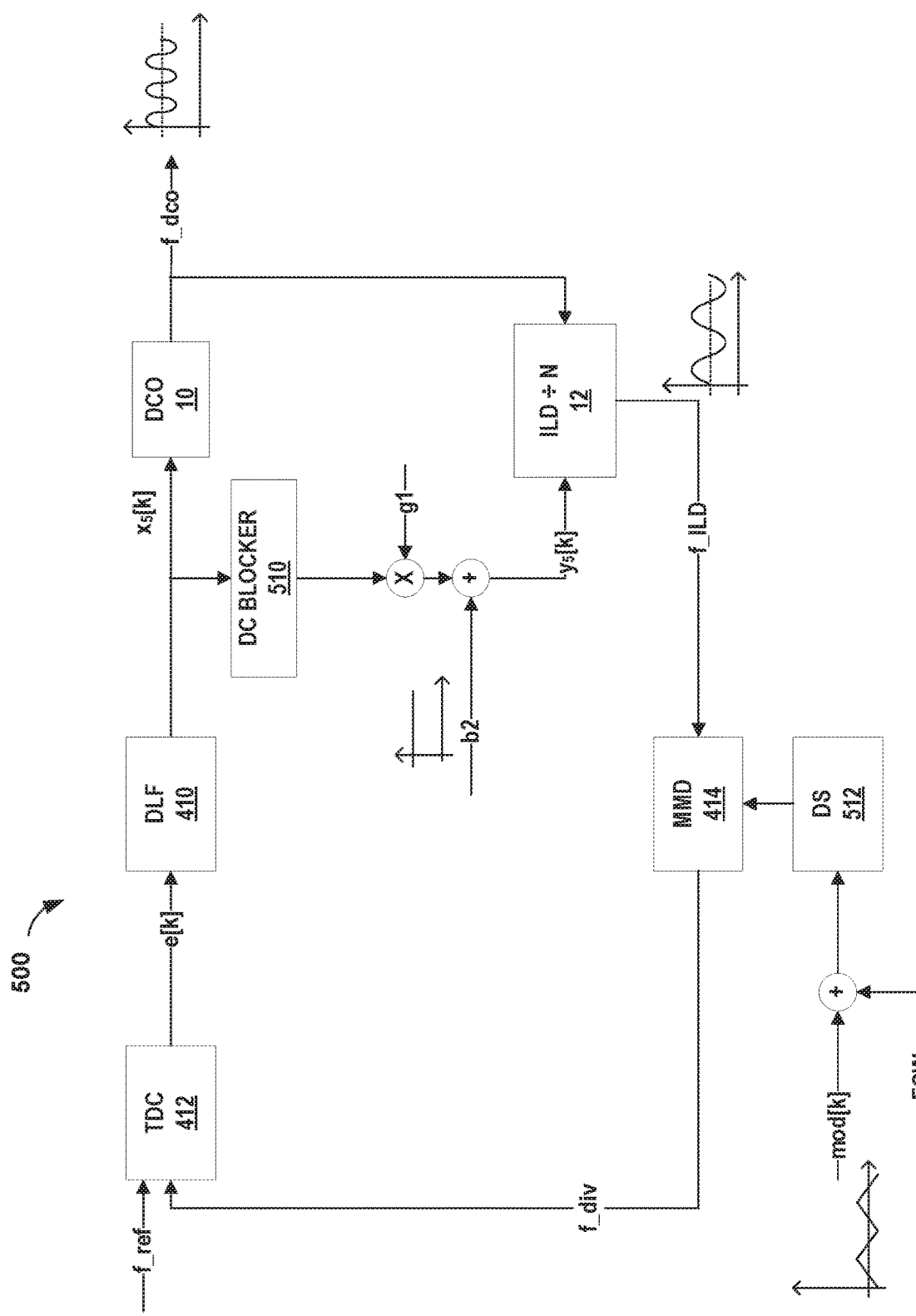
FIG. 5 is a schematic and conceptual block diagram illustrating an example PLL circuit with a modulation input using a robust DCO/ILD topology in accordance with one or more techniques of this disclosure.

FIG. 5 is a schematic and conceptual block diagram illustrating an example PLL circuit with a modulation input using a robust DCO/ILD topology in accordance with one or more techniques of this disclosure. Components and signals in PLL 500 depicted in FIG. 5 with the same reference numbers perform the same functions in PLL 500 as described in other PLL circuits of this disclosure. For example, DCO 10 and ILD 12 of PLL 500 perform the same functions as DCO 10 and ILD 12 as described in the explanations of FIGS. 1A, 3 and 4 above.

As with PLL 400 above, PLL 500 is a programmable frequency synthesizer with an output signal that tracks the phase and frequency of an input reference signal. PLL 500 also may be modulated by modulation input mod[k]. Modulation input mod[k] may include control words for a variety of applications, such as control words that modulate the frequency, phase amplitude or other characteristics of the output signal of PLL 500. In the example of FM, the modulated PLL output may include sawtooth, triangle, sinusoid or other types of FM.

PLL 500 includes DCO 10, ILD 12, MMD 414, TDC 412 and DLF 410, which perform the same functions as described above for FIG. 4. Additionally, PLL 500 receives bias signal b2, which correlates to bias signal b2 as depicted in FIG. 3 above and includes DC blocker 510 and delta sigma (DS) unit 512. PLL 500 may be used in a variety of applications, similar to PLL 400 above. Additionally, PLL 500 may operate in applications that may use FM including examples which incorporate large input amplitude FM, such as FMCW radar because the locking range of ILD 12, implemented in accordance with this disclosure, is able to operate with a large amplitude modulation input.

DC blocker 510 receives the filtered error signal, e[k], output from DLF 410. In the example of PLL 500, the input signal to DCO 10, x5[k] is the same as the filtered error signal, e[k], output from DLF 410. DC blocker 510 may be implemented as a digital filter that receives a digital word and outputs a digital word without a DC component. The input control word to ILD 12, y5[k] is the output of DC blocker 510 scaled by coefficient g1 and added to bias signal b2, similar to input control word y3[k] as described in relation to FIG. 3 above. Coefficient g1 correlates to coefficient g1 described above and depicted in FIGS. 1A and 3 above as well as FIGS. 6-9 below.

DS unit 512 receives sum of the modulation input, mod[k] and FCW. A delta-sigma driven MMD is one way to implement a fractional-N divider, which results in a fractional-N PLL.

MMD 414 receives the output of DS 512. MMD 414 correlates to MMD 414 described above for FIG. 4. As described, MMD 414 is a multi-modulus divider that divides the output frequency, f_ild, of ILD 12. MMD 414 may play a part in realizing the fractional division and may be considered part of a fractional-N architecture. MMD 414 may reduce the frequency of ILD 12 to a frequency usable by TDC 412.

PLL 500, implemented according to the techniques of this disclosure, may perform frequency synthesizer functions with robust phase locking performance. The use of ILD 12 instead of a CIVIL frequency divider may result in as much as ten times lower power consumption. Another advantage of a PLL implemented in accordance with the techniques of this disclosure is a more robust operation over a range of manufacturing variations, when compared to other conventional PLL circuit examples that attempt to use an ILD. In addition to variations in the FETs, depicted in FIGS. 2A-2D, there may be other on-chip variation (OCV) effects that manifest themselves, especially at smaller technology nodes. These may include process, voltage and temperature (PVT) variation effects with the components, the via structures as well as the on-chip interconnects. The limited injection locking range of some conventional ILDs may depend on PVT variation during manufacturing. The techniques of this disclosure exploit digital techniques to calibrate the PLL to overcome the PVT variation effects.

Furthermore, in examples in which PLL incorporates frequency modulation with a large input amplitude (e.g. FMCW radar application) the locking range of ILD 12, implemented in accordance with this disclosure, may operate with a large amplitude input. This is because the coefficient g1 may be calibrated by digital techniques to account for the mismatch between DCO and ILDCO gains. Digital techniques will be discussed in more detail in relation to FIGS. 8-10 below. Also, the DCO/ILD topology of this disclosure in which the ILD receives the same modulation input, with scaling, as the DCO, ensures continuous adjustment of the tuning range. Therefore, a PLL in accordance with this disclosure may have advantages by overcoming PVT variation and large amplitude FM input that may compromise performance of some examples of conventional frequency synthesizers that attempt to implement an ILD.

Figure 6:
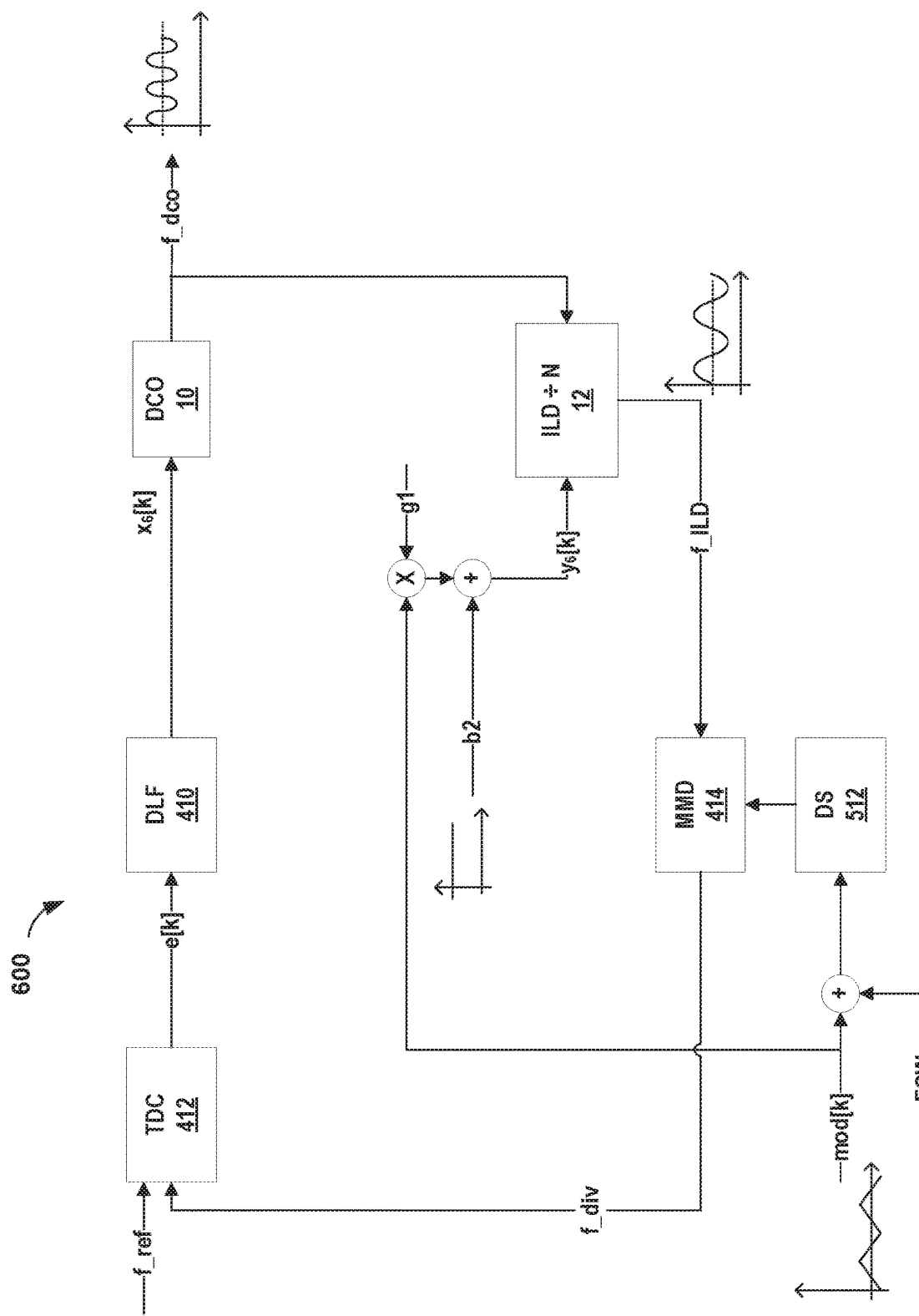
FIG. 6 is a schematic and conceptual block diagram illustrating an example PLL circuit using a robust DCO/ILD topology with a scaled modulation input directly to the ILD in accordance with one or more techniques of this disclosure.

FIG. 6 is a schematic and conceptual block diagram illustrating an example PLL circuit using a robust DCO/ILD topology with a scaled modulation input directly to the ILD in accordance with one or more techniques of this disclosure. In the example of FIG. 6, PLL 600 receives modulation input, mod[k] at DS unit 512 and after scaling and biasing, at ILD 12. Otherwise, PLL 600 operates in the same manner and with similar advantages as described above for PLL 500.

PLL 600 does not include DC blocker 510 as does PLL 500. Instead, ILD 12 receives modulation input mod[k] scaled by g1 and added to bias signal b2. Therefore, input control word y6[k] to the control input of ILD 12 is in accordance the following equation:

$$y_6[k]=g1*\text{mod}[k]+b2.$$

DCO 10 receives modulation input mod[k] through the feedback loop of MMD 414, TDC 412 and DLF 410. Therefore, both DCO 10 and ILD 12 receive the modulation input, which tunes the ILD natural frequency and minimizes $\Delta f\_inj$ as described above in relation to FIG. 1B.

Figure 7:
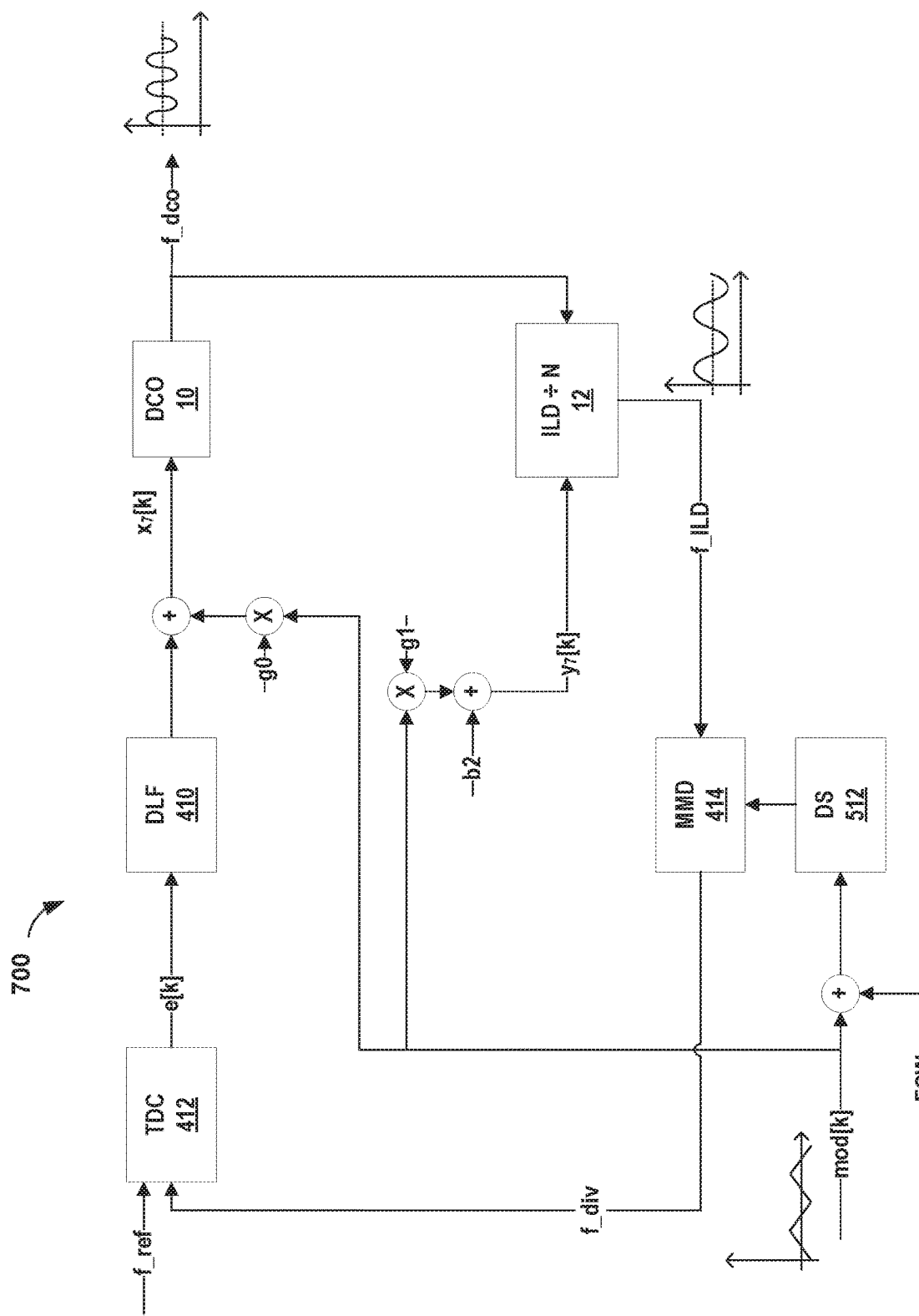
FIG. 7 is a schematic and conceptual block diagram illustrating an example PLL circuit with a two-point modulation input using a robust DCO/ILD topology in accordance with one or more techniques of this disclosure.

FIG. 7 is a schematic and conceptual block diagram illustrating an example PLL circuit with a two-point modulation input using a robust DCO/ILD topology in accordance with one or more techniques of this disclosure. Components in FIG. 7 with the same reference numbers as in other figures of this disclosure perform the same functions. For example, DCO 10 and DLF 410 correlate to DCO 10 and DLF 410 as described in relation to FIG. 4 above.

Example PLL 700 is a frequency synthesizer that incorporates a two-point modulation scheme. Two-point modulation may increase PLL bandwidth. Injecting modulation data at any single node of the PLL loop is either high-pass filtered or low-pass filtered. Therefore, a two-point modulation architecture may inject a modulation signal, such as mod[k] at two nodes simultaneously such that the sum of the two transfer functions becomes wideband. In some examples the injection nodes are the MMD and the main oscillator control voltage to achieve wide-bandwidth FM. The main oscillator may be a VCO, or in the example of PLL 600, the main oscillator is DCO 10. In some implementations, two-point modulation may cause some loss in signal-to-noise ratio (SNR) because of gain and phase mismatch between the two paths.

PLL 700 includes a coefficient, or gain, g0, which correlates the mismatch between the first modulation path and the second modulation path of the two-point modulation. The example of PLL 700 depicts the first path with modulation input mod [k] added to the output of DLF 410 and to bias signal b2. The first path therefore splits to inject the modulation input mod[k] to both DCO 10 and ILD 12. As described above, injecting the modulation input to both DCO 10 and ILD 12 tunes the natural frequency of ILD 12 to track the output frequency of DCO 10. ILD 12 input control word y7[k] includes modulation input mod[k] scaled by coefficient g1 and added to bias signal b2. As described above, coefficient g1 accounts for any mismatch between the gains of DCO 10 and ILD 12 while bias signal b2 allows setting the operating bias of ILD 12 independently from the operating bias of DCO 10.

MMD 414 receives the second modulation input after mod[k] is added to FCW and processed by DS 512. Therefore, the input control word, x7[k] to DCO 10 is the product of coefficient g0 and modulation input, mod[k] added to the filtered error signal output from DLF 410. In this manner coefficient g0 accounts for a mismatch between the first modulation input path to DCO 10 and ILD 12, and the second modulation input path injected into MMD 414. Coefficient g0 may be estimated by digital techniques, such as by adaptive filtering or a counter based technique, described in more detail below.

The calibration of coefficients g0 and g1, and continuous tuning of the natural frequency of ILD 12 in example PLL 700 allows the low power consumption advantages of ILD 12 in commercial applications that may not be available with some conventional PLLs. In examples in which modulation input mod[k] has a large amplitude, such as in the range of ten to fifteen percent of the tuning range of ILD 12, PLL 700 still delivers robust performance, where some examples of conventional PLL topology may not.

Figure 8:
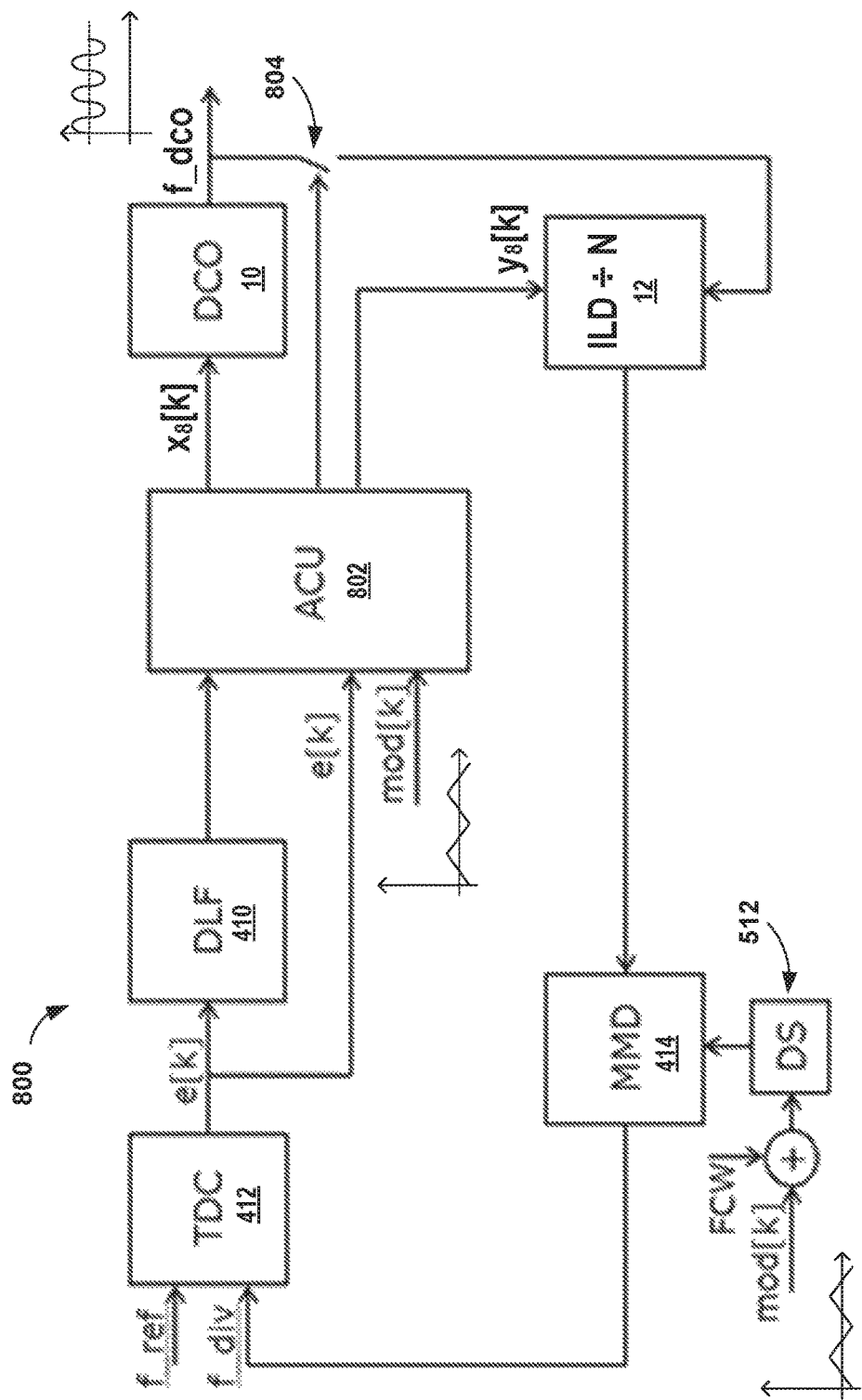
FIG. 8 is a schematic and conceptual block diagram illustrating an example PLL circuit with a two-point modulation input that incorporates an adaptive calibration unit to estimate coefficients in accordance with one or more techniques of this disclosure.

FIG. 8 is a schematic and conceptual block diagram illustrating an example PLL circuit with a two-point modulation input that incorporates an adaptive calibration unit to estimate coefficients in accordance with one or more techniques of this disclosure. As with other figures in this disclosure, where reference numbers of components of FIG. 8 are the same the reference numbers elsewhere in this disclosure, the components perform the same function.

In FIG. 8, an adaptive calibration unit (ACU) receives the modulation signal mod[k], error signal e[k] and produces DCO control signal x8[k] and ILD control signal y8[k]. Example PLL 800 may operate in either a calibration mode or in operating mode. In operating mode, PLL 800 operates like PLL 700 and PLL 805 described above and below with a two-point modulation injection. In the first modulation path, mod[k] is injected into adaptive control unit (ACU) 802 and further into DCO 10 and ILD 12, similar to the path described above for PLL 700. A second modulation path combines mod[k] with FCW and enters DS 512.

In calibration mode, a control signal from ACU 802 isolates DCO 10 from the PLL by opening switch 804. ILD 12 then becomes the primary oscillator for PLL 800. ACU 802 outputs control word y8[k] to ILD 12 without the influence of DCO 10. ACU 802 may exploit digital techniques to estimate calibration values for ILD 12 to ensure robust operation of PLL 800 over a wide range of conditions.

Figure 9:
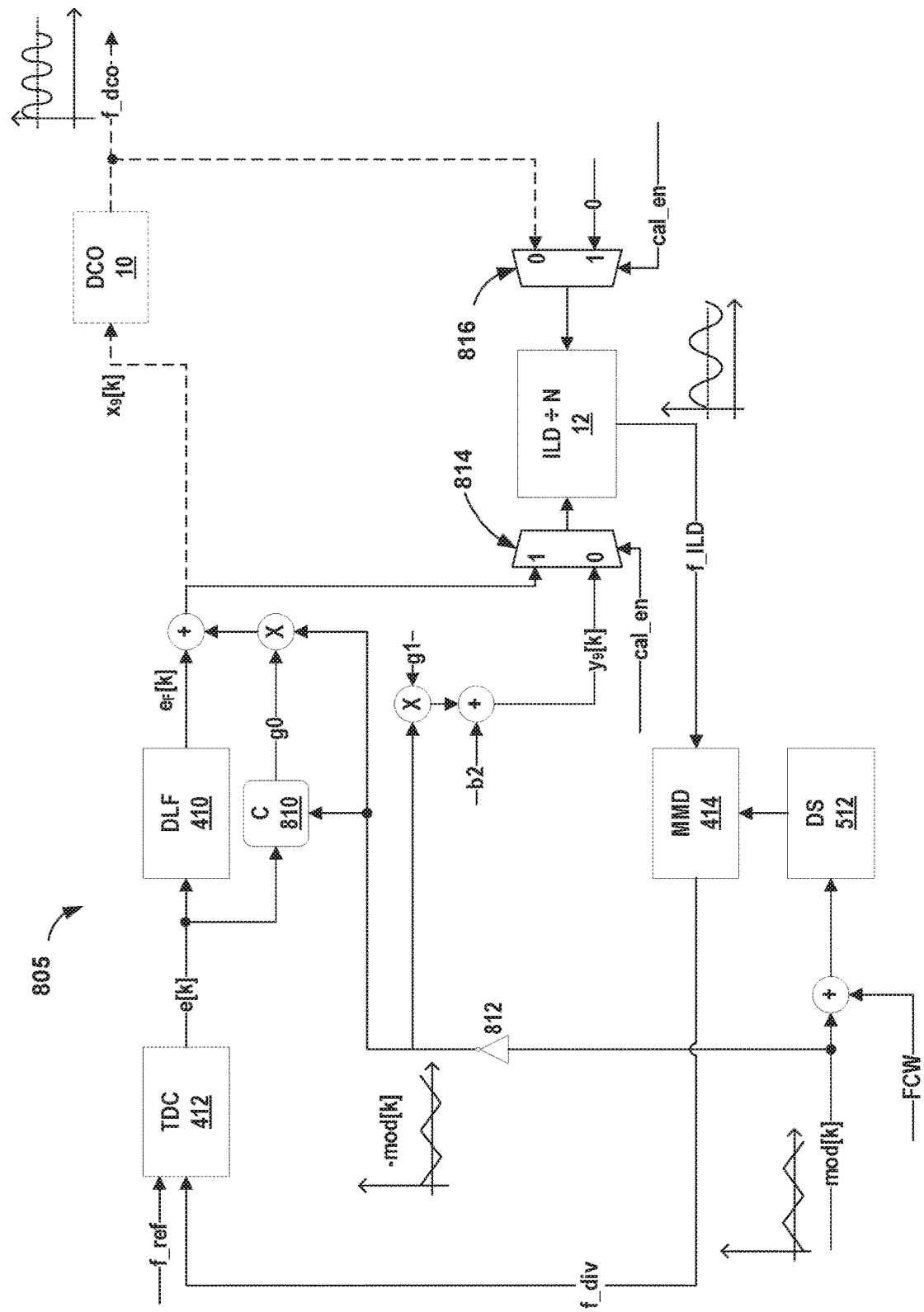
FIG. 9 is a schematic and conceptual block diagram illustrating an example PLL circuit with a two-point modulation input that incorporates digital techniques to estimate coefficients in accordance with one or more techniques of this disclosure.

FIG. 9 is a schematic and conceptual block diagram illustrating an example PLL circuit with a two-point modulation input that incorporates digital techniques to estimate coefficients in accordance with one or more techniques of this disclosure. FIG. 9 is an example implementation of the techniques of FIG. 8, described above. The DCO/ILD topology depicted in FIG. 1A, FIG. 8 and other figures in this disclosure, enable the use of these digital techniques. As with other figures in this disclosure, where reference numbers of components of FIG. 9 are the same the reference numbers elsewhere in this disclosure, the components perform the same function. For example, MMD 414 and DS 512 perform the same functions as described above for FIGS. 4-5, and elsewhere in this disclosure.

Correlator 810 receives both the inverted modulation input, -mod[k], and the output of TDC 412, error signal e[k]. Correlator 810 estimates and outputs the gain, g0, which operates the same as gain g0 described above for PLL 700. Correlator 810 may be implemented by any technique used to estimate the gain of an unknown system, such as adaptive filtering or other similar techniques. For example, a filter's operation may be viewed as extracting the information of interest from a signal and leaving behind a noise or interference signal. In the example of adaptive filtering, a filter may perform: (1) filtering, by using the present and past values of the input to determine the desired output, (2) smoothing, by using past, present, and future input values to determine the desired output, (3) prediction, by forecasting the quantity of interest into the future using present and past input data and similar functions. Some adaptive filtering techniques may include Kalman filtering, recursive least squares (RLS), and least mean squares (LMS).

Example PLL 805 may operate in either a calibration mode or in operating mode. In operating mode, PLL 805 operates like PLL 700 and PLL 800 described above with a two-point modulation injection. The first modulation path is mod[k] is scaled and injected into both DCO 10 and ILD 12, as described above for PLL 700. In the example of FIG. 9, inverter 812 reverses the polarity of mod[k] to −mod[k]. Inverter 812 is depicted in the conceptual diagram of to indicate a negative polarity of mod[k]. Alternatively, coefficients g0 and g1 and the input of correlator 810 may be configured to invert modulator input mod[k] in examples where a negative mod[k] is desirable.

The modulation input is scaled by coefficient g0 and added to the output of DLF 410, which is eF[k], in the example of PLL 805. eF[k] may be called the filtered error signal. Input control word x9[k] therefore follows the equation:

$$x_9[k]=e_F[k]-g0*\text{mod}[k],$$

and the input control word y9[k] follows the equation:

$$y_9[k]=b2-g1*\text{mod}[k].$$

For the second modulation path, MMD 414 receives the sum of FCW with modulation input mod[k] after processing by DS 512.

When in calibration mode, PLL 805 isolates DCO 10 from the loop and closes the loop through ILD 12. In calibration mode, ILD 12 acts as the PLL oscillator rather than DCO 10. PLL 805 exploits one or more digital techniques to calibrate the PLL, such as coefficient g1. PLL 805 enters calibration mode when the calibration enable signal cal_en is asserted, e.g. cal_en=1. Cal_en is an input to multiplexors 814 and 816.

Unlike PLL circuits 400-700, ILD 12 receives the output of DCO 10 at the ILD injection input through multiplexor 816. In calibration mode, cal_en disconnects the output signal from DCO 10, f_dco from the injection input of ILD 12. ILD 12 does not get any signal at the injection input, as indicated by the zero signal at the "1" input of multiplexor 816. Also, in operating mode ILD 12 receives control word y9[k] at the ILD control input through multiplexor 814. In calibration mode, multiplexor 814 disconnects y9[k] and instead enables control word x9[k] to enter the ILD control input. DCO 10 may continue to receive control word x9[k], but in calibration mode, DCO 10 is isolated from PLL 805 and ILD 12 acts as the PLL main oscillator.

With DCO 10 isolated and ILD 12 acting as the PLL main oscillator, the output of correlator 810, coefficient g0, is an estimate of gain of ILD 12. This technique uses the same circuit and components, such as MMD 414, DLF 410 and correlator 810 to estimate the gain of ILD 12. The gain may be expressed as MHz/LSB. Once correlator 810 converges on a value for coefficient g0, PLL 805 may end calibration mode and return to operating mode. The second coefficient, g1 may then be set to the value of coefficient g0 that was determined during calibration mode. In some examples, ACU 802 depicted in FIG. 8 may include correlator 810, multiplexor 814, inverter 812 and other elements depicted in FIG. 9.

PLL 805 may return to operating mode when calibration enable signal is no longer asserted. For example, set cal_en=0. Multiplexor 816 directs the output of DCO 10, f_dco, to the injection input of ILD 12. Multiplexor 814 directs the input control word y9[k] to the control input of ILD 12, rather than input control word x9[k]. As described above, input control word y9[k] includes bias signal b2, which sets the operating bias of ILD 12 to account for differences between the natural oscillation frequencies of DCO 10 and ILD 12, as described above in relation to FIGS. 5-7. Input control word y9[k] includes modulation signal mod[k] scaled by coefficient g1. Similar to coefficient g1 described above in relation to FIGS. 1A and 4, coefficient g1 allows ILD 12 to receive the same modulation input, mod [k], as main DCO 10 but scaled to account for any mismatch between DCO and ILDCO gains.

As described above, the architecture depicted by PLL 805 minimizes the frequency offset, Δf_inj, between the scaled natural oscillation frequency, N*f0_ild, of ILD 12 and DCO 10 frequency (f_dco) during modulation, where N is the ILD division ratio. Ensuring the natural oscillation frequency of ILD 12 tracks the frequency of output signal f_dco from DCO 10 makes the frequency lock of ILD 12 to DCO 10 robust and reduces the jitter contribution to PLL 805 from ILD 12, as described above in relation to FIG. 1B.

A robust DCO/ILD topology, as depicted in FIG. 9 may ensure low power robust frequency synthesizer operation of PLL 805. PLL 805 exploits digital techniques to estimate the gain of ILD 12 to feed the same modulation input mod[k] control signal information to both the DCO and the ILD to ensure robust frequency and phase lock of ILD 12 over a wide range of conditions. Unlike some conventional examples, the techniques of this disclosure account for any mismatch between DCO and ILD. In other words, the techniques of this disclosure do not depend on precise matching of components between DCO and ILD. A PLL in accordance with the techniques of this enclosure also provides robust performance in applications that incorporate large amplitude FM.

Figure 10:
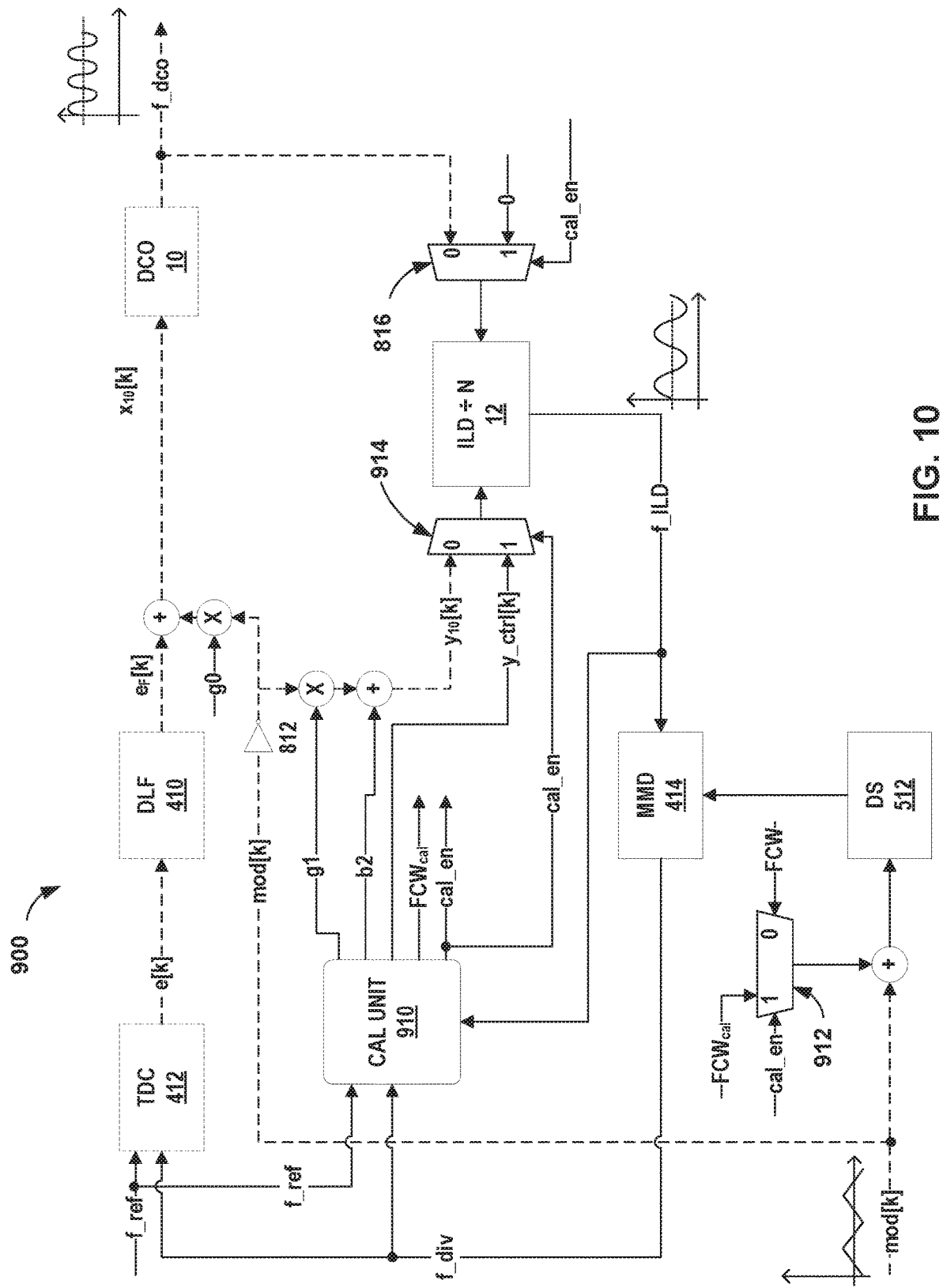
FIG. 10 is a schematic and conceptual block diagram illustrating an example PLL circuit with a two-point modulation input that incorporates an open loop calibration concept in accordance with one or more techniques of this disclosure.

FIG. 10 is a schematic and conceptual block diagram illustrating an example PLL circuit with a two-point modulation input that incorporates an open loop calibration concept in accordance with one or more techniques of this disclosure. FIG. 10 is an example implementation of some of the techniques of FIG. 8, described above. Similar to PLL 800 and PLL 805, PLL 900 also isolates DCO 10 during calibration, but PLL 900 also disconnects the modulation input mod[k] as well as the feedback loop through DLF 410 during calibration. DCO 10 may receive input x10[k], but the output of DCO 10 is isolated from the PLL.

While in operating mode, PLL 900 functions the same as PLL 700, PLL 800 and PLL 805 described above. For example, PLL 900 injects modulation input mod[k] through a first modulation path to both DCO 10 and ILD 12. ILD 12 input control word y10[k] includes the modulation input scaled by coefficient g1 and added to bias signal b2. MMD 414 receives the second modulation input after mod[k] is added to FCW and processed by DS 512, as described above.

Bias signal b2 and coefficient g1 perform the same functions as described above. For example, coefficient g1 accounts for any gain mismatch between DCO 10 and ILD 12 while bias signal b2 sets the operating bias of ILD 12 independent from DCO 10. However, PLL 900 calibrates bias signal b2 and coefficient g1 in a different manner than that described for PLL 805.

PLL 900 includes calibration unit 910. Calibration unit 910 receives as inputs reference frequency f_ref, feedback signal f_div, and the output of ILD 12, f_ild. Calibration unit 910 outputs calibration enable signal cal_en to multiplexors 816, 912 and 914. Other outputs of calibration unit 910 include ILD calibration control word y_ctrl[k], calibration frequency control word FCWcal, coefficient g1 and bias signal b2.

In calibration mode, calibration unit 910 asserts the calibration enable signal cal_en to multiplexors 816, 912 and 914. Multiplexor 816 correlates to multiplexor 816 depicted in FIG. 9. Multiplexor 816 disconnects the output of DCO 10 from the injection input of ILD 12. Multiplexor 912 replaces FCW with FCWcal as input to DS 512 for further input to MMD 414. Multiplexor 914 replaces input control word y10[k] with calibration control word y_ctrl[k] at the control input of ILD 12. Therefore, the calibration enable signal cal_en opens the loop of the PLL. Calibration unit 910 may operate using counter based or other similar techniques to determine coefficient g1 and bias signal b2 during open loop calibration mode.

Similar to coefficient g0 described in relation to PLL 700 and PLL 805, coefficient g0 correlates the mismatch between the first modulation path and the second modulation path of the two-point modulation. PLL 900 may exploit digital techniques to determine coefficient g0, as discussed above in relation to FIG. 9.

A PLL, such as PLL 400-900, may find use in applications such as frequency synthesizers for frequency modulation purposes including in FMCW mmwave frequency synthesizers described above. A PLL that employs an ILD, in accordance with techniques of this disclosure may reduce power consumption, for example on the order of ten times less than CIVIL based solutions. Lower power consumption may increase the competitiveness of components and products over those that consume more power. Moreover, the calibration and continuous adjustment of the ILD tuning range allows robust use of an ILD in frequency synthesizers for the large amplitude FM, such as required by FMCW radar application. The techniques of this disclosure exploit digital techniques to estimate the gain of the ILD to calibrate the PLL and account for any mismatch between DCO and ILD. The continuous adjustment of the ILD tuning range feeds the modulation signal to both the DCO and the ILD to ensure robust operation of the frequency synthesizer over a wide range conditions.

Figure 11:
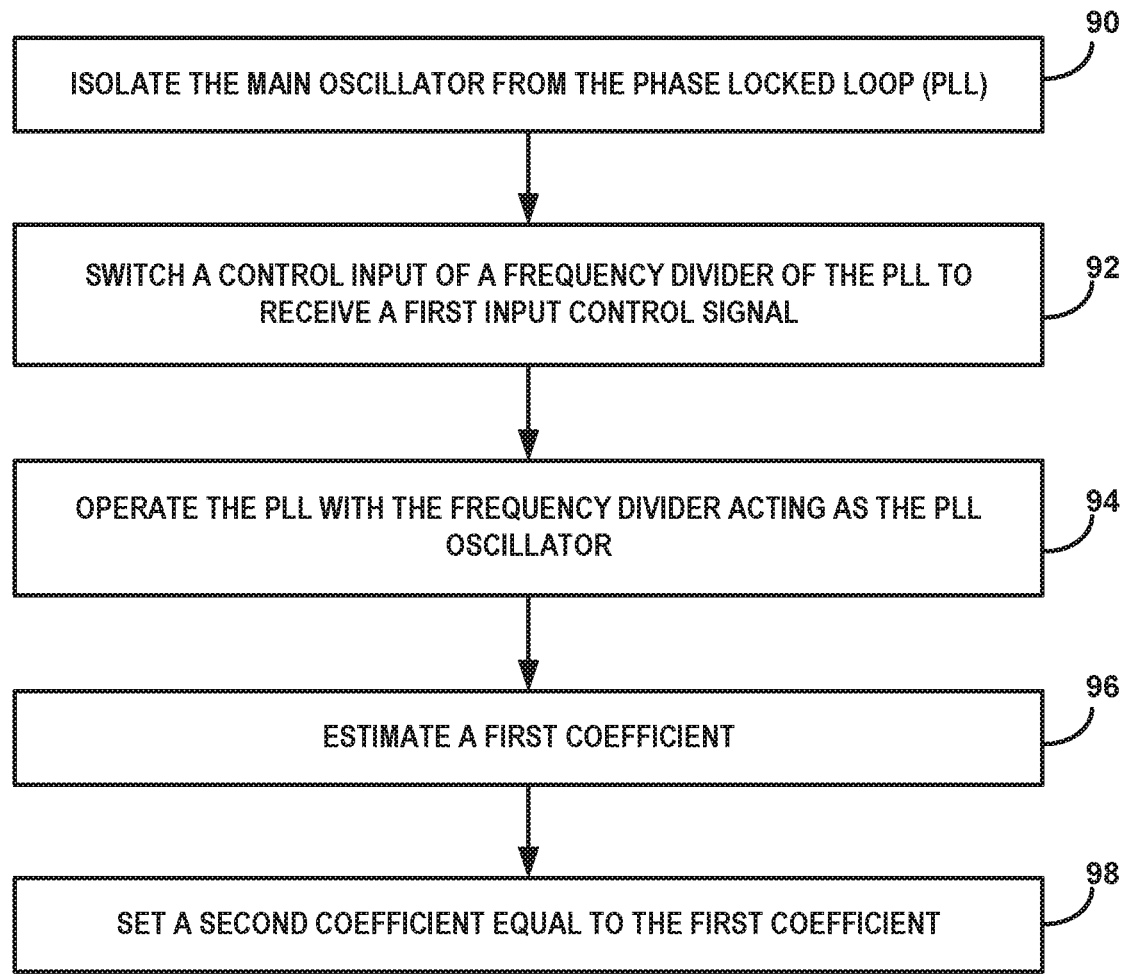
FIG. 11 is a flowchart illustrating the calibration mode of a PLL with a two-point modulation input that incorporates digital techniques to estimate coefficients in accordance with one or more techniques of this disclosure.

FIG. 11 is a flow chart illustrating the calibration mode of a PLL with a two-point modulation input that incorporates digital techniques to estimate coefficients in accordance with one or more techniques of this disclosure. The steps of FIG. 11 will be described in relation to PLL 805 of FIG. 9.

PLL 805 switches to calibration mode when the calibration enable signal cal_en is asserted. In the example of PLL 805, the calibration enable signal cal_en is asserted when cal_en=1. In other examples, the calibration enable signal cal_en may be asserted with a different value, such a digital low or other similar values.

Asserting the calibration enable signal cal_en isolates the main oscillator, DCO 10, from PLL 805 (90) by using multiplexor 816 to disconnect the output of DCO 10 from the injection input element of ILD 12. In some examples DCO 10 may still receive input control word x9[k], but the output of DCO 10 does not feed back through the loop when in calibration mode.

Asserting the calibration enable signal cal_en also causes multiplexor 814 to switch the control input of the injection locked digitally controlled oscillator, ILD 12, of PLL 805 to receive the input control signal, x9[k] (92). Multiplexor 814 directs input control word y9[k] to the control input of ILD 12 in operating mode. Therefore, in calibration mode, the control input of ILD 12 receives the input control signal, input control word x9[k], that DCO 10 received when in operating mode. Input control word x9[k] includes the inverted modulation input signal -mod[k], which is scaled by coefficient g0 and added to the filtered error signal eF[k]. The filtered error signal eF[k] is the output of DLF 410.

Isolating DCO 10 and switching the control input of the injection locked digitally controlled oscillator, ILD 12, in calibration mode operates PLL 805 by using the injection locked digitally controlled oscillator, ILD 12 as the PLL main oscillator (94) instead of using DCO 10 as the main oscillator. Therefore, the feedback loop through MMD 414, TDC 412 and DLF 410 does not include any signals from DCO 10. PLL 805 operates with signals from ILD 12. In other words, once in calibration mode, this allows the feedback loop to exploit digital techniques to estimate the gain of an unknown system, where the unknown system includes ILD 12 without influence from DCO 10. In some examples, the feedback loop is a least mean squares (LMS) loop.

With the injection locked digitally controlled oscillator, ILD 12, operating as the PLL oscillator, correlator 810 estimates coefficient g0 in the same manner as in operating mode. In other words, correlator 810 receives error signal e[k] and modulation input mod[k] to estimate coefficient g0 (96). As described above in relation to PLL 700, coefficient, or gain, g0 correlates the mismatch, if any, between the first modulation path and the second modulation path of the two-point modulation. In calibration mode, the first modulation input signal for PLL 805 follows the first modulation path through inverter 812 and is added to filtered error signal eF[k], which is the output of DLF 410.

The second modulation input signal follows the second modulation path to MMD 414. DS unit 512 receives the second modulation signal added to FCW and outputs the processed second modulation signal to MMD 414. This second modulation signal further follows the feedback path through TDC 412. Correlator 810 compares error signal e[k], which includes the second modulation signal, with the first modulation signal to estimate coefficient g0 (96). In calibration mode, coefficient g0 correlates any mismatch between the first and second modulation paths while ILD 12 is acting as the main PLL oscillator. When in operating mode, error signal e[k] will include the influence of DCO 10. Therefore, the adaptive filtering, or feedback loop, which includes correlator 810, may estimate a different value for coefficient g0 when in calibration mode than when in operating mode.

The coefficient g1 may be set equal to the coefficient g0 that was estimated in calibration mode (98). Coefficient g1, in operating mode, scales the modulation input, mod[k], to account for any mismatch between DCO and ILD gains. In calibration mode, with DCO 10 isolated and ILD 12 acting as the main PLL oscillator, correlator 810 converges on an estimate for g0 that will yield coefficient g1, where coefficient g1 is used by PLL 805 during operating mode. In this manner, PLL 805 uses a closed loop calibration technique that includes the same components and interconnections using during operating mode to calibrate parameters for PLL 805. The calibration, and continuous tuning of the ILD natural frequency enabled by the DCO/ILD topology of PLL 805 yield a phase locked loop with robust performance over a wide frequency range, as described above.

Example 1. A circuit comprising: a digitally controlled oscillator (DCO), and an injection locked digital digitally controlled oscillator frequency divider (ILD) that is configured to tune a natural oscillation frequency of the ILD to track a first signal from the DCO.

Example 2. The device of example 1, wherein the DCO includes a DCO input element and a DCO output element; wherein: the DCO input element receives a first input control word, the DCO output element outputs the first signal, the first input control word sets a frequency of the first signal.

Example 3. The device of any of examples 1-2 or any combination thereof, wherein the ILD includes an ILD control input element, an ILD injection input element and an ILD output element, wherein: the ILD control input element receives a second input control word, wherein the second input control word comprises the first input control word multiplied by a first coefficient, the second input control word sets a natural oscillation frequency of the ILD, the ILD injection input element receives the first signal from the DCO output, the ILD output element outputs a second signal from the ILD output, wherein a phase of the second signal is synchronized to a phase of the first signal and the natural oscillation frequency sets a frequency of the second signal.

Example 4. The device of any combination of examples 1-3, wherein the first input word further comprises a first bias signal, the second input word further comprises a second bias signal, and the first bias signal and the second bias signal set an operating bias of the DCO and the ILD such that the frequency of the second signal is approximately a fraction of the frequency of the first signal.

Example 5. The device of any combination of examples 1-4, wherein the first input word comprises a modulation input and wherein the modulation input causes a frequency modulation in the first signal at the DCO output.

Example 6. The device of any combination of examples 1-5, wherein the frequency of the first signal is within a locking range of the ILD.

Example 7. The device of any combination of examples 1-6, wherein the frequency of the second signal is half the frequency of the first signal.

Example 8. A phased-locked loop (PLL) circuit comprising: an injection locked digital digitally controlled oscillator (ILD) with an ILD control input element, an ILD injection input element and an ILD output element, an adaptive control unit (ACU), wherein the ACU: receives an error signal and a first modulation input signal and outputs an ILD control signal and a digitally controlled oscillator (DCO) control signal, and a digital loop filter (DLF) wherein the DLF receives the error signal and outputs a filtered error signal to the ACU, wherein: the ILD control input element receives the ILD control signal, wherein the ILD control word sets a natural oscillation frequency of the ILD, and the ILD outputs a first output signal from the ILD output element, wherein the natural oscillation frequency sets a frequency of the first output signal, and the error signal comprises the first output signal.

Example 9. The PLL circuit of example 8, further comprising a calibration mode, wherein the ACU determines the ILD control signal based on the filtered error signal, the error signal and the first modulation input signal.

Example 10. The PLL circuit of any combination of examples 8-9, further comprising a digitally controlled oscillator (DCO), wherein the ILD is configured to tune the natural oscillation frequency of the ILD to track a second output signal from the DCO.

Example 11. The PLL circuit of any combination of examples 8-10, wherein the ILD control signal and the DCO control signal comprise the first modulation input signal.

Example 12. The PLL circuit of any combination of examples 8-11, wherein the DCO includes a DCO input element and a DCO output element, the DCO input element receives the DCO control signal, the DCO outputs the second output signal at the DCO output element, the DCO control signal received by the DCO input element sets a frequency of the second output signal, the ILD injection input element receives the second output signal from the DCO output element, and a phase of the first output signal from the ILD output element is synchronized to a phase of the second output signal from the DCO output element.

Example 13. The PLL circuit of any combination of examples 8-12, further comprising a time to digital converter (TDC), which includes a TDC output element, a first TDC input element and a second TDC input element, wherein: the TDC outputs the error signal at the TDC output element, the first TDC input element receives a reference frequency input signal, and the second TDC input receives a loop feedback signal, wherein the loop feedback signal comprises the first output signal from the ILD output.

Example 14. The PLL circuit of any combination of examples 8-13, wherein a PLL output element is the DCO output element and the phase of the second output signal from the DCO output element is synchronized with a phase of the reference frequency input signal.

Example 15. The PLL circuit of any combination of examples 8-14, further comprising a multi-modulus divider (MMD), including an MMD control input element, an MMD injection input element, and an MMD output element and wherein: the MMD control input element receives an MMD control signal comprising the sum of a second modulation input and a frequency control word (FCW), the MMD injection input element receives the first output signal from the ILD output element, and the MMD outputs a loop feedback signal, and wherein the MMD control signal sets the frequency of the loop feedback signal.

Example 16. The PLL circuit of any combination of examples 8-15, further comprising a delta-sigma (DS) unit, wherein the DS unit receives the sum of the second modulation input and the FCW and outputs the MMD control signal to the MMD control input element.

Example 17. The PLL circuit of any combination of examples 8-16, wherein the first modulation input is equal to the inverse polarity of the second modulation input.

Example 18. A method comprising switching a phased locked loop (PLL) to calibration mode, wherein calibration mode comprises: isolating a main oscillator from the PLL, switching a control input of an injection locked digitally controlled oscillator (ILD) of the PLL to receive a first input control signal, operating the PLL with the ILD as a PLL oscillator, and estimating, by an adaptive control unit (ACU) of the PLL, a calibration value, wherein: the ACU receives as input an error signal and a first modulation input signal, and the calibration value correlates a first modulation input signal to a second modulation input signal.

Example 19. The method of example 18, wherein the ACU estimates the calibration value by means of adaptive filtering, wherein adaptive filtering comprises one or more of Kalman filtering, recursive least squares (RLS), and least mean squares (LMS).

Example 20. The method of any combination of examples 18-19, further comprising switching the PLL to operating mode, wherein operating mode comprises: switching the control input of the ILD of the PLL to receive a second input control signal, wherein the second input control signal comprises the first modulation input scaled by the calibration value, setting a control input of the main oscillator to receive the first input control signal, connecting the output signal of the main oscillator to an injection input element of the ILD, and operating the PLL with the main oscillator acting as the PLL oscillator.

Various embodiments of the disclosure have been described. These and other embodiments are within the scope of the following claims.

The invention claimed is:

1. A phased-locked loop (PLL) circuit comprising:
an injection locked digital digitally controlled oscillator (ILD) with an ILD control input element, an ILD injection input element and an ILD output element; and
an adaptive control unit (ACU), wherein the ACU is configured to:
receive an error signal,
output a digitally controlled oscillator (DCO) control signal,
output an ILD control word wherein:
the ILD control input element is configured to receive the ILD control word, wherein the ILD control word is configured to set a natural oscillation frequency of the ILD, and
the ILD is configured to output a first output signal from the ILD output element, wherein the natural oscillation frequency is configured to set a frequency of the first output signal; and
wherein the ILD control word and the DCO control signal comprise a first modulation input signal.

2. The PLL circuit of claim 1, further comprising a digital loop filter (DLF) wherein the DLF is configured to:
receive the error signal, and
output a filtered error signal to the ACU.

3. The PLL circuit of claim 2, wherein the ACU is further configured to receive the first modulation input signal.

4. The PLL circuit of claim 3, wherein the error signal comprises the first output signal.

5. The PLL circuit of claim 4, further comprising a DCO, wherein the ILD is configured to tune the natural oscillation frequency of the ILD to track a second output signal from the DCO.

6. The PLL circuit of claim 1, wherein:
the DCO includes a DCO input element and a DCO output element,
the DCO input element is configured to receive the DCO control signal,
the DCO is configured to:

output the second output signal at the DCO output element; and
set a frequency of the second output signal based on the DCO control signal received by the DCO input element, the ILD injection input element is configured to receive the second output signal from the DCO output element, and the ILD is configured to synchronize a phase of the first output signal from the ILD output element to a phase of the second output signal from the DCO output element.

7. The PLL circuit of claim 6, further comprising a time to digital converter (TDC), which includes a TDC output element, a first TDC input element and a second TDC input element, wherein:
the TDC is configured to output the error signal at the TDC output element,
the first TDC input element is configured to receive a reference frequency input signal, and
the second TDC input is configured to receive a loop feedback signal, wherein the loop feedback signal comprises the first output signal from the ILD output.

8. The PLL circuit of claim 7, wherein a PLL output element is the DCO output element and the phase of the second output signal from the DCO output element is synchronized with a phase of the reference frequency input signal.

9. The PLL circuit of claim 5, further comprising a multi-modulus divider (MMD), including an MMD control input element, an MMD injection input element, and an MMD output element and wherein:
the MMD control input element is configured to receive an MMD control signal comprising the sum of a second modulation input and a frequency control word (FCW),
the MMD injection input element is configured to receive the first output signal from the ILD output element, and
the MMD is configured to output a loop feedback signal, and wherein the MMD is configured to set the frequency of the loop feedback signal based on the MMD control signal.

10. The PLL circuit of claim 9, further comprising a delta-sigma (DS) unit, wherein the DS unit is configured to:
receive the sum of:
the second modulation input; and
the FCW; and
output the MMD control signal to the MMD control input element.

11. The PLL circuit of claim 10, wherein the first modulation input is equal to an inverse polarity of the second modulation input.

12. A method comprising switching a phased locked loop (PLL) to calibration mode, wherein calibration mode comprises:
isolating a main oscillator from the PLL;
switching a control input element of an injection locked digitally controlled oscillator (ILD) of the PLL to receive a first input control word, wherein the ILD comprises the ILD control input element, an ILD injection input element and an ILD output element;
operating the PLL with the ILD as a PLL oscillator;
outputting, by the ILD, a first output signal from the ILD output element;
receiving, by a digital loop filter (DLF), an error signal;
outputting, by the DLF, a filtered error signal;
receiving, by an adaptive control unit (ACU) of the PLL, as input: the error signal, the filtered error signal and a first modulation input signal,
outputting, by the ACU, an ILD control word to the ILD control element, wherein:
the ILD control word is configured to be determined based on the filtered error signal, the error signal and the first modulation input signal,
the ILD control word is configured to set a natural oscillation frequency of the ILD, and
the natural oscillation frequency is configured to set a frequency of the first output signal from the ILD; and
estimating, by the ACU, a calibration value, wherein the calibration value correlates the first modulation input signal to a second modulation input signal.

13. The method of claim 12, wherein the ACU estimates the calibration value by means of adaptive filtering, wherein adaptive filtering comprises one or more of Kalman filtering, recursive least squares (RLS), and least mean squares (LMS).

14. The method of claim 12, further comprising switching the PLL to operating mode, wherein operating mode comprises:
switching the control input of the ILD of the PLL to receive a second input control signal, wherein the second input control signal comprises the first modulation input scaled by the calibration value;
setting a control input of the main oscillator to receive the first input control signal;
connecting the output signal of the main oscillator to an injection input element of the ILD; and
operating the PLL with the main oscillator acting as the PLL oscillator.

15. A phased-locked loop (PLL) circuit comprising:
an injection locked digital digitally controlled oscillator (ILD) with an ILD control input element, an ILD injection input element and an ILD output element;
an adaptive control unit (ACU), wherein the ACU is configured to:
receive an error signal;
output an ILD control word wherein:
the ILD control input element is configured to receive the ILD control word, wherein the ILD control word is configured to set a natural oscillation frequency of the ILD, and
the ILD is configured to output a first output signal from the ILD output element, wherein the natural oscillation frequency is configured to set a frequency of the first output signal; and
a digital loop filter (DLF) wherein the DLF is configured to:
receive the error signal, and
output a filtered error signal to the ACU, and
wherein the PLL is configured to operate in a calibration mode, wherein while in calibration mode the ACU is configured to determine the ILD control word based on the filtered error signal, the error signal and a first modulation input signal.

16. The PLL circuit of claim 15, further comprising a digitally controlled oscillator (DCO),
wherein the ILD is configured to tune the natural oscillation frequency of the ILD to track a second output signal from the DCO, and
wherein the ACU is configured to output a DCO control signal.

17. The PLL circuit of claim 16, wherein:
the DCO includes a DCO input element and a DCO output element,
the DCO input element is configured to receive the DCO control signal, the DCO is configured to:
  output the second output signal at the DCO output element; and
  set a frequency of the second output signal based on the DCO control signal received by the DCO input element,
the ILD injection input element is configured to receive the second output signal from the DCO output element, and
the ILD is configured to synchronize a phase of the first output signal from the ILD output element to a phase of the second output signal from the DCO output element.

18. The PLL circuit of claim 17, further comprising a time to digital converter (TDC), which includes a TDC output element, a first TDC input element and a second TDC input element, wherein:
  the TDC is configured to output the error signal at the TDC output element,
  the first TDC input element is configured to receive a reference frequency input signal, and
  the second TDC input is configured to receive a loop feedback signal, wherein the loop feedback signal comprises the first output signal from the ILD output.

19. The PLL circuit of claim 18, wherein a PLL output element is the DCO output element and the phase of the second output signal from the DCO output element is synchronized with a phase of the reference frequency input signal.

20. The PLL circuit of claim 15, further comprising a multi-modulus divider (MMD), including an MMD control input element, an MMD injection input element, and an MMD output element and wherein:
  the MMD control input element is configured to receive an MMD control signal comprising the sum of a second modulation input and a frequency control word (FCW),
  the MMD injection input element is configured to receive the first output signal from the ILD output element, and
  the MMD is configured to output a loop feedback signal, and wherein the MMD is configured to set the frequency of the loop feedback signal based on the MMD control signal.

* * * * *